(12) United States Patent
Miller et al.

(10) Patent No.: US 6,864,618 B2
(45) Date of Patent: Mar. 8, 2005

(54) METHOD FOR OPERATING A MICROELECTROMECHANICAL SYSTEM USING A STIFF COUPLING

(75) Inventors: Samuel Lee Miller, Albuquerque, NM (US); Stephen Matthew Barnes, Albuquerque, NM (US); Murray Steven Rodgers, Albuquerque, NM (US)

(73) Assignee: Memx, Inc., Albuquerque, NM (US)

( * ) Notice: Subject to any disclaimer, the term of this patent is extended or adjusted under 35 U.S.C. 154(b) by 0 days.

(21) Appl. No.: 10/688,024

(22) Filed: Oct. 17, 2003

(65) Prior Publication Data

US 2004/0080240 A1 Apr. 29, 2004

Related U.S. Application Data

(62) Division of application No. 10/099,464, filed on Mar. 14, 2002.

(51) Int. Cl.[7] .......................... H02N 1/00; G02B 26/08
(52) U.S. Cl. ......................... 310/309; 385/18; 359/223; 359/198
(58) Field of Search ..................... 310/309; 385/16, 385/18, 22; 359/223–226, 198, 872; 74/490.1–490.15

(56) References Cited

U.S. PATENT DOCUMENTS

| | | | | |
|---|---|---|---|---|
| 5,867,302 A | * | 2/1999 | Fleming | 359/291 |
| 5,960,132 A | * | 9/1999 | Lin | 385/18 |
| 6,082,208 A | * | 7/2000 | Rodgers et al. | 74/406 |
| 6,175,170 B1 | | 1/2001 | Kota et al. | 310/40 |
| 6,253,001 B1 | | 6/2001 | Hoen | 385/17 |
| 6,283,601 B1 | | 9/2001 | Hagelin et al. | 359/871 |
| 6,621,681 B2 | | 9/2003 | Rodgers et al. | 361/222 |
| 6,640,023 B2 | | 10/2003 | Miller et al. | 385/17 |
| 2001/0048265 A1 | | 12/2001 | Miller et al. | 310/309 |

FOREIGN PATENT DOCUMENTS

JP 6-160750 * 6/1994 ........... G02B/26/08

\* cited by examiner

*Primary Examiner*—Karl Tamai
(74) *Attorney, Agent, or Firm*—Marsh Fischmann & Breyfogle LLP

(57) ABSTRACT

A microelectromechanical system is disclosed that uses a stiff tether between an actuator assembly and a lever that is interconnected with an appropriate substrate such that a first end of the lever may move relative to the substrate, depending upon the direction of motion of the actuator assembly. Any appropriate load may be interconnected with the lever, including a mirror for any optical application.

11 Claims, 15 Drawing Sheets

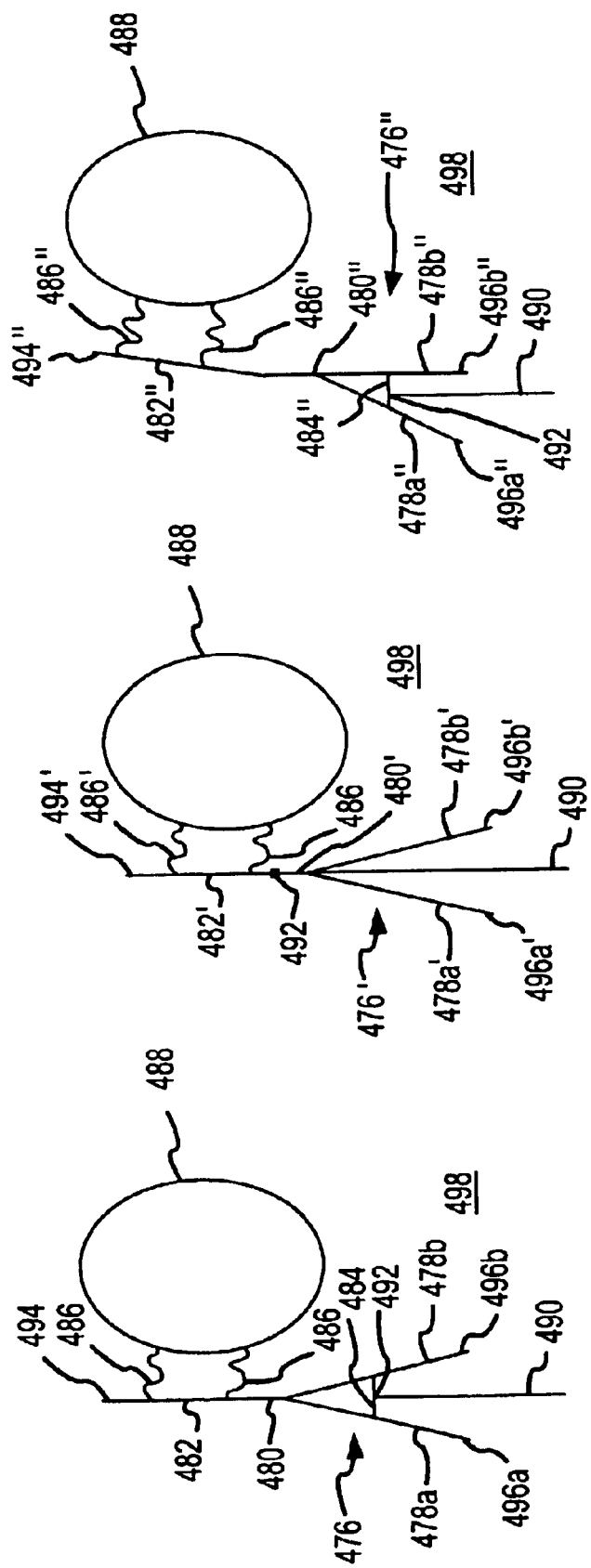

METHOD FOR OPERATING A MICROELECTROMECHANICAL SYSTEM USING A STIFF COUPLING

CROSS-REFERENCE TO RELATED APPLICATIONS

This patent application is a divisional of, and claims priority under 35 U.S.C. §120 to, pending U.S. patent application Ser. No. 10/099,464, that is entitled "MICROELECTROMECHANICAL SYSTEM WITH STIFF COUPLING," that was filed on Mar. 14, 2002, and the entire disclosure of which is incorporated by reference in its entirety herein.

FIELD OF THE INVENTION

The present invention relates to the field of microelectromechanical systems and, more particularly to a microelectromechanical system that uses a stiff coupling between an actuator assembly and a load.

BACKGROUND OF THE INVENTION

Microelectromechanical (MEM) systems are getting a significant amount of attention in the field of optical switches. MEM technology generally involves the fabrication of small mechanical devices on a silicon substrate, together with electronic circuitry for actuating motion of the mechanical device. Surface micromachining is one type of fabrication technique for MEM systems. Surface micromachining generally entails depositing alternate layers of structural material and sacrificial material on an appropriate substrate, such as a silicon wafer, which functions as a foundation for the resulting microstructures. Various patterning operations may be executed on one or more of these layers before the next layer is deposited so as to define the desired microstructures. After the microstructures have been defined in this general manner, the various sacrificial layers are removed by exposing the microstructures and the various sacrificial layers to one or more etchants which "releases" the resulting microstructures from the substrate (e.g., to allow relative movement).

A MEM-based optical system may include multiple mirror microstructures formed on a substrate for making optical connections. Each mirror microstructure may be interconnected with at least one lift assembly, one or more actuators, and one or more displacement multipliers. The lift assembly may be used to raise the mirror microstructure above the plane of the substrate and/or tilt the mirror into an appropriate position to provide a desired optical function. The actuators are attached to the substrate so as to be movable relative thereto, and provide the motive force/displacement that is used to raise/tilt these mirrors. Electrostatic actuators are commonly used in these types of systems. These types of actuators produce a short stroke displacement which may be insufficient to raise/tilt the mirror to a desired level in at least certain instances. Therefore, the noted displacement multiplier(s) is typically disposed between the actuator and its associated lift assembly to increase the displacement provided by the actuator to the lift assembly, and to thereby allow the mirror microstructure to be raised/tilted to a desired degree. One example of a displacement multiplier is disclosed in U.S. Pat. No. 6,175,170.

Displacement multipliers may be designed to produce a relatively large output based upon a relatively small input. However, displacement multipliers can become rather intricate, which increases development costs. Moreover, displacement multipliers often require a significant amount of space on a die. Since there is only a fixed amount of space within a die for fabrication of the microelectromechanical system, the use of one or more displacement multipliers may reduce the mirror density within the die. Although this may be acceptable for certain applications, a higher mirror density may be desirable for other applications. Therefore, it would be desirable to achieve displacement multiplication for a microelectromechanical system in a manner that allows for increased mirror density.

A tether or the like may be disposed within the interconnection between a mirror elevator and the actuator(s). For instance, an actuator or a plurality of actuators may be interconnected with an input to a displacement multiplier, and the tether may interconnect the output of the displacement multiplier with the mirror elevator. This mirror elevator may have a free end that moves away from and toward the substrate, depending upon the direction of the movement of the actuator(s). This then raises and/or tilts a mirror that may be interconnected with the elevator.

One previously contemplated configuration for the above-noted tether was to form the same from a single layer of a structural material in a surface micromachined optical system. This resulted in the tether being flexible.

SUMMARY

Generally, the present invention is embodied in a microelectromechanical (MEM) system having what may be characterized as a lift assembly that is elevatable from a substrate in response to an input displacement that is typically (although not required to be) at least generally parallel with the substrate. The substrate is one that is appropriate for MEM applications. The lift assembly is operable to move an end of an elevation member of the lift assembly at least generally away from or toward the substrate in response to an input displacement, where the movement of the elevation member's free end at least generally away from or toward the substrate is "multiplied" without requiring the use of a separate displacement multiplier. Any appropriate microstructure may be interconnected with this elevation member and for any appropriate application, including without limitation a mirror microstructure for any appropriate optical application (e.g., optical switches, attenuators, multiplexers, and de-multiplexers).

A MEM system of a first aspect of the present invention is preferably fabricated by surface micromachining, although other MEM fabrication techniques or combination of fabrication techniques may be utilized as desired/required. In any case, the MEM system includes: a substrate; any appropriate actuator that is movably interconnected with the substrate in any appropriate manner; a first elevation member that is interconnected with the substrate at a first location (e.g., at one end of the first elevation member, although the first elevation member could be interconnected with the substrate at an intermediate location that is between a pair of its ends) and a free end that is movable at least generally away from or toward the substrate, depending upon the directional movement of the actuator; and a coupling or "tether" that is disposed between and interconnects the actuator to a portion of the first elevation member that is able to move at least generally away from or toward the substrate. Any configuration may be used for this tether. What is important is that the tether attaches to the first elevation member at a location that is between the first location where the first elevation member is interconnected with the substrate and a free end thereof. The benefit of attaching the tether to a location that is between where the first elevation member is interconnected with the substrate and a free end of the first elevation member is that, by adjusting the attachment location along the length of the first elevation member, the displacement of the first elevation member's free end may be altered (i.e., multiplied/ amplified) with respect to the input displacement without requiring the use of a separate displacement multiplier. Since the MEM system of the first aspect does not require the use a displacement multiplier to produce a multiplied lift for the first elevation member (that is often necessary in various optical applications and possibly others as well), more room on the substrate is available for other microstructures. Accordingly, a higher packing density of microstructures (e.g., mirrors) may be achieved on the substrate.

Various refinements exist of the features noted in relation to the first aspect of the present invention. Further features may also be incorporated in the first aspect of the present invention as well. These refinements and additional features may exist individually or in any combination. The first elevation member in the case of the first aspect again is interconnected with the substrate at a first location and has a free end that is operable to move at least generally away from the substrate in response to an input displacement. Any type of motion of the free end of the first elevation member may be utilized and in any manner that is at least generally away from or toward the substrate. In one embodiment, the free end moves along a path that is at least generally within a plane that is at least generally perpendicular to the substrate. In another embodiment, the free end moves along a path that is at least generally within a plane that is disposed in non-perpendicular relation to the substrate. In another embodiment the movement of the free end of the first elevation member is not confined to being within a reference plane.

Any way of interconnecting the first elevation member with the substrate in a manner that allows a free end thereof to at least generally move away from or toward the substrate may be utilized. The first elevation member may be compliantly attached to the substrate such that the portion of the first elevation member between the first location and its free end is able to rotate or "pivot" about this connection point, and thus allow this free end to move at least generally away from or toward the substrate with a displacement that has both a component that is lateral to the substrate and a component that is perpendicular to the substrate (e.g., along an arcuate path). In one embodiment, a portion of the first elevation member is connected directly to the substrate at the first location, and the first elevation member "bends" or flexes to provide the desired motion for the free end of the first elevation member at least generally away from or toward the substrate. In this configuration, the first elevation member may have first and second cross-sectional areas along its length. As will be appreciated, if the entire first elevation member is made of the same material (e.g., polycrystalline silicon) and in the same structural layer, the portion of the first elevation member with the smaller cross-sectional area will have a smaller moment of inertia about a particular axis and, thus, will be less stiff than the larger cross-sectional area portion. Accordingly, this smaller cross-sectional portion may be formed over that portion of the first elevation member that is attached to the substrate and act as what may be characterized as an integral flexible/ compliant hinge, thereby allowing the free end of the first elevation member to move at least generally away from or toward the substrate.

In another embodiment associated with the first aspect, a separate moving or movable hinge (e.g., multiple and discrete parts that are movably interconnected) may be used to movably interconnect the first elevation member with the substrate such that the free end of the first elevation member is able to move at least generally away from or toward the substrate in the desired/required manner. Any structure for establishing this hinge and/or manner of interconnecting the hinge/hinge members with the substrate and/or first elevation member may be utilized. In yet another embodiment of the first aspect, a compliant or flexible hinge of sorts may be used to movably interconnect the first elevation member and the substrate. This compliant hinge may be anchored to the substrate (e.g., by passing through one or more structural layers of a surface micromachined microelectromechanical system), and may also be appropriately anchored to the first elevation member. Accordingly, this compliant hinge may have a stiffness that is less than that of the first elevation member (and preferably a stiffness less than that of its anchor as well) such that a force acting on the first elevation member may bend this compliant hinge before bending the first elevation member. As will be appreciated, this compliant hinge may be formed so that it has a first stiffness in one direction and a second stiffness in a second direction that is greater than the first stiffness. For example, the compliant hinge may be formed as a strip with a rectangular cross-section that has a width greater than its height or thickness. In this embodiment, the compliant hinge will be less stiff about an axis that is parallel with its width axis, while remaining stiffer in the axis perpendicular to its width. In this regard, the compliant hinge may permit the first elevation member to be pivoted in effect about only a single axis so as to allow for controlled movement of the compliant hinge and thereby the first elevation member (as well as any microstructure interconnected therewith).

In order to move a free end of the first elevation member at least generally away from or toward the substrate, the MEM system associated with the first aspect again includes an actuator that is operable to produce an at least generally lateral movement relative thereto (e.g., so as to move at least generally across the substrate). Any appropriate type of actuator may be utilized (e.g., electrostatic comb actuator, a capacitive-plate electrostatic actuator, a thermal actuator, a movable-electrode electrostatic actuator, a piezoelectric actuator, an electromagnetic actuator and a magnetic actuator), and any appropriate way of interconnecting the same with the substrate to allow relative movement in the desired/required manner may be utilized as well. Moreover, multiple actuators may be used and interconnected with a single coupling or tether to exert the desired force on the first elevation member to move a free end thereof at least generally away from or toward the substrate. For example, a pair of actuators may be used in parallel, where the separate actuators are coupled by a laterally moveable yoke formed on the substrate. In this regard, the tether that interconnects the actuators with the elevation member may be interconnected (directly or indirectly) to this yoke so the combined force of the separate actuators is applied to the first elevation member through the tether.

The actuator microstructure is interconnected with the first elevation member and operable to provide the displacement that has the effect of moving a free end of the first elevation member at least generally away from or toward the substrate in the subject first aspect. In this regard, a laterally movable output of the actuator microstructure may be transferred to the first elevation member by a coupling or "tether" as noted above, where one end of the tether may be attached directly to the actuator microstructure and another end of the tether may be directly attached to the first elevation member between the first location where the first elevation member is interconnected with the substrate and a free end thereof. That is, in one embodiment there is no "intermediate" structure in the interconnection of the actuator with the connector (e.g., no displacement multiplier). When the actuator microstructure is engaged, such as to produce an "in-plane" or lateral displacement, the tether exerts a force on the first elevation member and thereby moves a free end thereof at least generally away from or toward the substrate. In another embodiment, an actuator may be used in conjunction with a displacement multiplier where the first elevation member is attached to the output of a displacement multiplier by the noted tether and where the input of the displacement multiplier is interconnected with the actuator.

The tether in the case of the subject first aspect is disposed or located at least somewhere between the actuator and the first elevation member, and interconnects the actuator to a location that is between the first location where the first elevation member is interconnected with the substrate and a free end thereof. As noted, the tether may be used to exert a force on the first elevation member so as to move a free end thereof at least generally away from the substrate when the actuator produces an in-plane or lateral displacement. In addition, the tether may be used to move the free end of the first elevation member back at least toward the plane of the substrate when the actuator is disengaged or moved in an opposite direction than that which moved the free end at least generally away from the substrate. Typically, the microelectromechanical system of the first aspect will use both directions of motion of the first end of the first elevation member. For instance, a pair of first elevation members may be interconnected with a mirror microstructure. Movement of the first free end of both of these first elevation members at least generally away from the substrate may be used to achieve one position for the mirror microstructure. Thereafter, the free end of one of the first elevation members may be moved at least generally away from or toward the substrate to tilt the mirror microstructure in a desired manner. Moreover, the first ends of both first elevation members may be moved at least generally away from or toward the substrate to tilt the mirror microstructure in a desired manner or to "lower" the mirror microstructure.

Any appropriate configuration for the first elevation member may be utilized by the first aspect of the present invention, as well as any manner of movably interconnecting the same with the substrate. For instance, the first elevation member could be a single simple beam. Another option would be to define the first elevation member by a plurality of legs or beams that are appropriately interconnected. One or more cross beams may extend between and interconnect two or more of these legs to provide a desired degree of rigidity to the first elevation member.

To produce a multiplied displacement in the first elevation member with a component that is at least generally away from or toward the substrate in the case of the first aspect, a first end of the tether may be interconnected with the first elevation member at a point that is between the first location where the same is interconnected with the substrate and a free end thereof, and a second end of the tether may be interconnected with the actuator. Further, the system may be arranged such that the actuator and the end of the tether interconnected therewith (the second end) are maintained in a fixed positional relationship during movement of the actuator such that the actuator and the second end of the tether move in a one-to-one ratio. Contrast this with situations where a displacement multiplier interconnects the actuator with the noted second end of the tether. In this case, the second end of this tether (attached to the output of the displacement multiplier) would move more than the actuator because of the multiplication provided by the displacement multiplier.

The tether associated with the first aspect may be attached anywhere between a free end of the first elevation member and the first location where the first elevation member is interconnected with the substrate, such that the tether transmits the displacement from the actuator to the first elevation member. Therefore, when the actuator is moved relative to the substrate (whether actively by an appropriate signal, passively by a spring force from one or more sources, by a combination thereof, or in any other manner), the tether may exert a force on the first elevation member, causing the first elevation member to pivot with respect to the substrate at least generally at/about the first location. As will be appreciated, this pivoting produces an angular displacement of the first elevation member and, by moving the tether attachment point on the first elevation member closer to the pivot point, a greater angular displacement of the first elevation member can be obtained using the same input displacement. Accordingly, depending on the length of the first elevation member, the length of the tether and the displacement stroke of the actuator, a displacement of a free end of the first elevation member that is greater than the input displacement of the actuator may be produced.

A second aspect of the present invention is embodied in a microelectromechanical system that includes what may be characterized as a lever or a lever assembly that is interconnected with a substrate that is used in the fabrication of the microelectromechanical system. The coupling is interconnected with the lever at a second location that is disposed between a first free end of the lever ("free" in the sense that it is able to move relative to the substrate) and a first location where the lever is interconnected with the substrate (e.g., a part of the lever that does not move laterally relative to the substrate or in a dimension that is at least generally parallel with the substrate, such as by being anchored to the substrate). This first location may define a pivot point or axis of sorts. In any case, a force is exerted on the coupling, which is then transferred to the lever at the second location where the coupling interfaces with the lever. The first free end of the lever then moves relative to the substrate in response to the application of this force to the lever.

Various refinements exist of the features noted in relation to the second aspect of the present invention. Further features may also be incorporated in the second aspect of the present invention as well. These refinements and additional features may exist individually or in any combination. The attachment of the coupling to the lever at the second location that is between its first free end and the first location where the lever is interconnected with the substrate amplifies the amount that the first free end of the lever moves in response to a certain lateral movement of an opposite end of the coupling, in comparison to attaching the coupling directly to the first free end of the lever. For instance, an actuator assembly (e.g., one or more actuator microstructures) may be interconnected with an end of the coupling that is opposite that which interfaces with the lever at the second location in this second aspect. Assume that the stroke of the actuator assembly is fixed at a first distance. For this same first distance, a variety of different displacements of the first free end of the lever may be realized by changing the attachment point of the coupling to the lever. Moving the attachment point of the coupling to the lever so as to be closer to the first location amplifies the displacement of the first free end of the lever for the same fixed displacement of the actuator assembly.

Any configuration for the lever may be utilized in relation to the second aspect. For instance, the lever may be defined by single beam or may be defined by a plurality beams that are structurally interconnected. A single coupling may be interconnected with a multi-beam lever structure so as to simultaneously move each of the various beams (e.g., by attaching to an interconnecting beam). Multiple couplings could also be utilized.

Any appropriate way of establishing the above-noted "first location" on the lever may be utilized in relation to the second aspect. For instance, the lever may be anchored to an underlying structure of the microelectromechanical system at the first location, such as the substrate. One way to characterize the lever is that the same is movably interconnected with another portion of the microelectromechanical system, for instance by using a multi-piece hinge, pivot, or bearing configuration, or by using one or more compliant members and/or compliant properties (e.g., to allow for a certain degree of flexure or the like, to in turn allow for the desired movement of the first free end of the lever relative to the substrate).

Movement of the first free end of the lever relative to the substrate may be in any direction and along any appropriate path. In one embodiment, the first free end of the lever moves at least generally away from the substrate. This movement may be within a reference plane that is at least generally perpendicular to the substrate, within a reference plane that is disposed in non-perpendicular relation to the substrate, or in any manner that is at least generally away from or toward the substrate (e.g., the movement of the first free end need not be confined to being within a reference plane). In another embodiment of the subject second aspect, the first free end of the lever moves within a reference plane that is at least generally parallel with the substrate.

The third through the sixth aspects generally relate to the identification that the use of a flexible coupling or tether to transfer motion from an actuator assembly to a lever may adversely affect one or more aspects of a microelectromechanical system that uses such a lever in at least certain applications (for instance, optical). Consider the case where a lever (of any appropriate configuration, and including for example a single beam or a plurality of appropriately interconnected beams) is interconnected with a substrate that is appropriate for microelectromechanical applications, that this interconnection allows for movement of a first end of the lever at least generally about a first location, where a microstructure(s) (e.g., a mirror) is interconnected with a portion of this lever that is able to move relative to the substrate, and where an elongate tether or coupling interconnects (directly or indirectly) the lever with an actuator assembly (e.g., one or more actuators that are appropriate for microelectromechanical applications). When the actuator assembly moves relative to the substrate, to in turn move both the tether and the first free end of the lever relative to the substrate, the magnitude of the total external forces that are experienced by the tether (e.g., an actuation force (including a resultant force) that is intended to move the tether from one position to another; inertial forces from movement of the lever and any microstructure interconnected therewith), the manner in which these external forces are exerted on the tether (e.g., how abruptly the actuation force is terminated), or both may be such that a tether of insufficient stiffness would tend to flex or bow between its two opposite ends. Any such elastic deformation or buckling of the tether may adversely affect the control of the movement of the microstructure(s) that is interconnected with the movable portion of the lever. Not only could the transmission of the actuation force to the microstructure interconnected with the lever be somewhat delayed by any significant amount of flexing of the tether, but a flexed tether would eventually release the elastic energy stored therein to either "slap" or accelerate the interconnected microstructure in the direction of motion or otherwise cause the interconnected microstructure to vibrate or oscillate after the motion of the actuator assembly has been terminated. The third through the sixth aspects of the present invention address the identification of this potential problem.

A third aspect of the present invention is embodied in a microelectromechanical (MEM) system having a lever that is interconnected with but movable relative to a substrate in response to an input displacement that is typically, at least generally, parallel with the substrate. The substrate is one that is appropriate for use in the fabrication of microelectromechanical systems. A free end of the lever moves at least generally about a first location (e.g., where the lever is anchored to the substrate or otherwise movably interconnected with the substrate) and relative to the substrate in response to an input displacement. Any appropriate microstructure may be interconnected with any portion of the lever that is movable relative to the substrate and for any appropriate application, including without limitation a mirror microstructure for optical applications.

The MEM system of the third aspect of the present invention is preferably fabricated by surface micromachining, although other fabrication techniques or combination of fabrication techniques may be utilized as desired/required. In any case, the MEM system of the third aspect includes a substrate, an actuator assembly that is movably interconnected with the substrate in any appropriate manner, a first lever that is interconnected with the substrate for movement at least generally about a first location and that has a first free lever end that is movable relative to the substrate at least generally about the first location, and an elongate coupling or "tether" that is disposed between and interconnects the actuator assembly and the first lever (either directly or indirectly). Any configuration may be used for this tether. What is important is that the tether is sufficiently stiff so as to withstand the external forces applied thereto without substantially bowing or buckling.

The benefit of using a tether that is sufficiently stiff to withstand the external forces that may be applied to the tether due/in response to a movement of the actuator assembly (including how the motion of the actuator assembly is initiated and/or maintained, as well as how the motion of the actuator assembly is terminated) in accordance with the third aspect is that a slapping and/or oscillatory effect associated with less stiff tethers is eliminated or at least significantly reduced. For example, a tether that will flex or bow when exposed to external forces of at least a certain magnitude will result in elastic energy being stored within the tether. When this elastic energy is released, this may cause a free end of the lever to accelerate in an undesired manner, may cause this free end of the lever to vibrate or oscillate, or both. The release of this elastic energy may significantly adversely affect the ability to precisely control the operation of the microelectromechanical system, may cause undesired contact between components of the microelectromechanical system and possibly resulting structural damage, or both. Using a stiff tether (such that no significant elastic energy is stored in the tether as a result of typical external forces being exerted thereon) in accordance with the third aspect addresses these types of deficiencies. Stiff tethers also may allow for increasing the switching speed in the case where the third aspect is used in an optical application (e.g., when a mirror microstructure is interconnected with a portion of the first lever that is movable relative to the substrate).

Various refinements exist of the features noted in relation to the third aspect of the present invention. Further features may also be incorporated in the third aspect of the present invention as well. These refinements and additional features may exist individually or in any combination. Initially, the features discussed above in relation to the first and second aspects may be utilized in the subject third aspect in any combination. Any appropriate configuration may be used for the lever that is associated with the third aspect that provides the desired stiffness. Moreover, any way of interconnecting the lever with the substrate to allow its first free lever end to move relative to the substrate may be utilized as well. Movement of the first free lever end relative to the substrate may be in any direction and along any appropriate path. In one embodiment, the first free lever end moves at least generally away from or toward the substrate, depending upon the direction of motion of the actuator assembly. This type of movement may be within a reference plane that is at least generally perpendicular to the substrate, within a reference plane that is disposed in non-perpendicular relation to the substrate, or in any manner that is at least generally away from or toward the substrate (e.g., the movement of the first free lever end need not be confined to being within a reference plane). In another embodiment of the subject third aspect, the first free lever end moves within a reference plane that is at least generally parallel with the substrate.

The tether in the case of the third aspect may be used to pull the first free lever end away from the substrate when the actuator produces an in-plane displacement or one that is at least generally parallel with the general lateral extent of the substrate (e.g., the actuator moves at least generally horizontally). In addition, the tether may be used to lower the first free lever end back toward the substrate. In accordance with the third aspect of the present invention, the tether has a stiffness that is sufficient to withstand external forces (e.g., an actuation force, inertial forces) that are applied to the tether due to or as a result of an acceleration of the actuator assembly (positive or negative), while moving the first free lever end relative to the substrate. "Withstand" in this context means without substantially flexing or bending.

The actuator assembly that is associated with the third aspect may include one or more actuators that are appropriate for microelectromechanical applications. The actuation force that is exerted on the tether may be active, passive, or some combination of active and passive. For instance, an active force may be generated by transmitting an appropriate signal to the actuator assembly. A passive force, on the other hand, may involve the release of stored or potential energy. For instance, energy may be stored in the interconnecting structure between the actuator assembly and the substrate, and the release of this energy may be characterized as being part of or contributing to the actuation force. Energy that is stored in one or more other components of the microelectromechanical system of the third aspect may also contribute to the total actuation force that is exerted on the coupling (e.g., in a separate compliant member that interconnects the two ends of the tether to the relevant structure).

A fourth aspect of the present invention is embodied in a microelectromechanical system that is fabricated using an appropriate substrate. The system includes a lever that is somehow movably interconnected with the substrate at a first location such that a first free lever end of the lever is able to move relative to the substrate at least generally about the first location. An actuator assembly is interconnected with the substrate for movement at least generally along a first path. An elongate coupling interconnects the lever and this actuator assembly. One end of the elongate coupling is interconnected (directly or indirectly) with the actuator assembly, while the opposite end of the elongate coupling is interconnected (directly or indirectly) with a portion of the lever that is able to move relative to the substrate in a direction that depends upon the direction of the actuation force being exerted on the elongate coupling by/through a movement of the actuator assembly relative to the substrate. Movement of the first free lever end relative to the substrate in a first direction is accomplished by the actuator assembly moving relative to the substrate in a second direction that results in the exertion of what may be characterized as a first actuation force on the elongate coupling that is transferred to the lever. Movement of the first free lever end relative to the substrate in a third direction (different from the first direction) is accomplished by the actuator assembly moving relative to the substrate in a fourth direction (different from the second direction) that results in the exertion of what may be characterized as second actuation force on the elongate coupling that is transferred to the lever. The elongate coupling is configured to have a certain minimum buckle strength between opposite ends of the elongate coupling that defines its length. The maximum actuation force that is exerted on the elongate coupling as a result of movement of the actuator assembly relative to the substrate during operation of the microelectromechanical system has at least a first component that is directed along the first path. The noted minimum buckle strength of the elongate coupling is greater than that the magnitude of this first component in the case of the fourth aspect.

Various refinements exist of the features noted in relation to the fourth aspect of the present invention. Further features may also be incorporated in the fourth aspect of the present invention as well. These refinements and additional features may exist individually or in any combination. Initially, any of the features discussed above in relation to the first and second aspects may be incorporated in the subject fourth aspect as well, alone or in any combination. Although the fourth aspect may be appropriate for any number of applications, in one embodiment a mirror or the like is interconnected with a portion of the lever that is able to move at least generally away from and toward the substrate (e.g., to lift and/or tilt a mirror relative to the substrate by interconnecting the mirror with a portion of the lever that is able to move relative to the substrate).

Any appropriate configuration may be used for the lever that is associated with the fourth aspect. Moreover, any way of interconnecting the lever with the substrate may be utilized so as to allow the first free lever end to move relative to the substrate at least generally about the first location in the case of the fourth aspect (e.g., via one or more compliant members, via a multi-piece pivot or hinge, via a configuration of that portion of the lever that is interconnected with the substrate). Movement of the first free end of the lever relative to the substrate may be in any direction and along any appropriate path. In one embodiment, the first free lever end moves at least generally away from or toward the substrate, depending upon the direction of motion of the actuator assembly. This type of movement may be within a reference plane that is at least generally perpendicular to the substrate, within a reference plane that is disposed in non-perpendicular relation to the substrate, or in any manner that is at least generally away from or toward the substrate (e.g., the movement of the first free lever end need not be confined to being within a reference plane). In yet another embodiment of the subject fourth aspect, the first free lever end moves within a reference plane that is at least generally parallel with the substrate.

The actuator assembly that is associated with the fourth aspect may include one or more actuators that are appropriate for microelectromechanical applications. The actuation force applied to the elongate coupling may be active, passive, or some combination of active and passive. An active actuation force may be generated by transmitting an appropriate signal to the actuator assembly. A passive actuation force, on the other hand, may involve the release of stored energy. For instance, energy may be stored in the interconnecting structure between the actuator assembly and the substrate, and the release of this energy may be characterized as being part of the actuation force. Moreover, energy may be stored in other portions of the microelectromechanical system of the fourth aspect (e.g., a compliant member that interconnects the elongate coupling and the lever), and the release of this energy may be characterized as being part of the actuation force.

In one embodiment of the fourth aspect, the elongate coupling has a length of at least about 750 microns, and in another embodiment a length of at least about 1,300 microns (again, measured between its two ends). In another embodiment, the component of the actuation or restoring force that is directed along the first path of movement of the actuator assembly is at least about 20 $\mu$N. One way in which the desired buckle strength may be realized for the elongate coupling utilized by the fourth aspect is by forming the elongate coupling from multiple, spaced structural layers that are rigidly interconnected at a plurality of intermediate locations between the opposite ends of the elongate coupling.

There are a number of additional ways to characterize the elongate coupling of the fourth aspect being configured to have the above noted buckle strength. One is that the elongate coupling is stiff. Others are that the movement, speed, acceleration, or any combination thereof, of the first free lever end relative to the substrate is at least substantially solely controlled by external forces that are exerted on the elongate coupling. That is, no significant portion of the forces that cause the first free lever end to move relative to the substrate are due to any internal forces that may exist within the elongate coupling due to being placed in compression as a result of the application of the actuation force thereto through movement of the actuator assembly in the relevant direction. Yet another is that a stiffness of the elongate coupling is such that the elongate coupling undergoes at least substantially no elastic deformation when the actuator assembly exerts the actuation force on the elongate coupling to move the first free lever end relative to the substrate through movement of the actuator assembly in the relevant direction.

A fifth aspect of the present invention is embodied in a microelectromechanical system that is fabricated using an appropriate substrate. The system includes a lever that is somehow interconnected with the substrate such that a first free lever end of the lever is movable relative to the substrate at least generally about a first location. An actuator assembly is interconnected with the substrate for movement at least generally along a first path. An elongate coupling interconnects the lever and the actuator assembly. This elongate coupling is formed by a plurality of vertically spaced structural layers that are rigidly interconnected at typically a plurality of spaced locations (e.g., formed via surface micromachining). One end of the elongate coupling is interconnected (directly or indirectly) with the actuator assembly, while the opposite end of the elongate coupling is interconnected (directly or indirectly) with a portion of the lever that is able to move relative to the substrate in a direction that depends upon the direction of the actuation force being exerted on the elongate coupling by/through a movement of the actuator assembly. Movement of the first free lever end relative to the substrate in a first direction is accomplished by a movement of the actuator assembly in a second direction that results in the exertion of what may be characterized as a first actuation force on the elongate coupling that is transferred to the lever. Movement of the first free lever end relative to the substrate in a third direction (different from the first direction) is accomplished by a movement of the actuator assembly in a fourth direction (different that the second direction) that results in the exertion of what may be characterized as second actuation force on the elongate coupling that is transferred to the lever.

Various refinements exist of the features noted in relation to the fifth aspect of the present invention. Further features may also be incorporated in the fifth aspect of the present invention as well. These refinements and additional features may exist individually or in any combination. Initially, any of the features discussed above in relation to the first and second aspects may be incorporated in the subject fifth aspect as well, alone or in any combination. Although the fifth aspect may be appropriate for any number of applications, in one embodiment a mirror or the like is interconnected with a portion of the lever that is able to move at least generally away from and toward the substrate (e.g., to lift and/or tilt a mirror relative to the substrate by interconnecting the mirror with a portion of the lever that is able to move relative to the substrate).

Any appropriate configuration may be used for the lever that is associated with the fifth aspect. Moreover, any way of interconnecting the lever with the substrate may be utilized so as to allow a free end thereof to move relative to the substrate at least generally about the first location in the case of the fifth aspect (e.g., via one or more compliant members, via a multi-piece pivot or hinge, via a configuration of that portion of the lever that is interconnected with the substrate). Movement of the first free lever end relative to the substrate may be in any direction and along any appropriate path. In one embodiment, the first free lever end moves at least generally away from or toward the substrate, depending upon the direction of motion of the actuator assembly. This type of movement may be within a reference plane that is at least generally perpendicular to the substrate, within a reference plane that is disposed in non-perpendicular relation to the substrate, or in any manner that is at least generally away from or toward the substrate (e.g., the movement of the first free lever end need not be confined to being within a reference plane). In another embodiment of the subject fifth aspect, the first free lever end moves within a reference plane that is at least generally parallel with the substrate.

The actuator assembly that is associated with the fifth aspect may include one or more actuators that are appropriate for microelectromechanical applications. The actuation force that is applied to the elongate coupling may be active, passive, or some combination of active and passive. An active actuation force may be generated by transmitting an appropriate signal to the actuator assembly. A passive force, on the other hand, may involve the release of stored energy. For instance, energy may be stored in the interconnecting structure between the actuator assembly and the substrate, and the release of this energy may be characterized as being part of the actuation force. Moreover, energy may be stored in other portions of the microelectromechanical system of the fifth aspect (e.g., a compliant member that interconnects the elongate coupling and the lever), and the release of this energy may be characterized as being part of the actuation force.

In one embodiment of the fifth aspect, the elongate coupling has a length of at least about 750 microns, and in another embodiment a length of at least about 1,300 microns (again, measured between its two ends). Forming the elongate coupling of the fifth aspect from multiple structural layers may provide a certain minimum buckle strength between the opposite ends of the coupling. In this regard, the design of the microelectromechanical system of the fifth aspect may be such that actuator assembly of the fifth aspect exerts a maximum magnitude of the actuation force on the elongate coupling, and that has at least a first component that is directed along the first path. The noted minimum buckle strength of the elongate coupling is preferably greater than that the magnitude of this first component in this particular embodiment of the fifth aspect. In one embodiment, the component of the actuation force that is directed along the first path of movement of the actuator assembly is at least about 20 $\mu$N.

There are a number of additional ways to characterize the elongate coupling of the fifth aspect being configured to have the noted buckle strength. One is that the elongate coupling is stiff. Others are that the movement, speed, acceleration, or any combination thereof, of the first free lever end relative to the substrate is at least substantially solely controlled by external forces that are exerted on the elongate coupling. That is, no significant portion of the forces that cause the first free lever end to move relative to the substrate are due to any internal forces that may exist within the elongate coupling due to being placed in compression as a result of the application of the actuation force thereto through a movement of the actuator assembly in the relevant direction. Yet another is that a stiffness of the elongate coupling is such that the elongate coupling undergoes at least substantially no elastic deformation when the actuator assembly exerts the actuation force on the elongate coupling to move the first free lever end relative to the substrate through a movement of the actuator assembly in the relevant direction.

A sixth aspect of the present invention is directed to a method for operating a microelectromechanical system that is fabricated using an appropriate substrate, and that includes an elongate coupling that is interconnected with a lever. This method includes accelerating the elongate coupling. Accelerating the elongate coupling results in the elongate coupling being placed in compression at least at some point in time. This acceleration also moves a first lever end of the lever relative to the substrate based on its interconnection with the elongate coupling. The movement of the first lever end relative to the substrate is at least substantially solely controlled by external forces that are exerted on said elongate coupling. That is, no significant portion of the forces that cause the first lever end to move relative to the substrate are due to any internal forces that may exist within the elongate coupling due to being placed in compression by an acceleration of the elongate coupling.

Various refinements exist of the features noted in relation to the sixth aspect of the present invention. Further features may also be incorporated in the sixth aspect of the present invention as well. These refinements and additional features may exist individually or in any combination. The acceleration of the elongate coupling may be provided by or as a result of a movement of an actuator assembly relative to the substrate. One or more actuators of any appropriate type may be utilized by such an actuator assembly. Movement of the actuator assembly may be active (e.g., by applying an appropriate signal to the actuator assembly), passive (e.g., via a return force that is exerted on the actuator assembly by a suspension that movably interconnects the actuator assembly with the substrate), or some combination thereof. There may be one or more other contributing sources to the acceleration of the elongate coupling as well. For instance, elastic energy may be stored in a compliant member that may be used to interconnect one or both ends of the elongate coupling with adjacent portions of the system (e.g., with the lever; with the actuator assembly; with a displacement multiplier that is disposed between and that interconnects the actuator assembly and the elongate coupling).

Movement of the first lever end relative to the substrate in the case of the sixth may be in any direction and along any appropriate path. In one embodiment, the movement of the first lever end is at least generally within a reference plane that is at least generally perpendicular to the substrate. In another embodiment, the movement of the first lever end is at least generally within a reference plane that is disposed in non-perpendicular relation to the substrate. In yet another embodiment, the movement of the first lever end is at least generally parallel with a lateral extent of the substrate. Typically the first lever end moves along an at least generally arcuate path relative to the substrate, although other types of movements may be utilized.

One way in which the movement of the first lever end relative to the substrate in the case of the sixth aspect may be accomplished by using only external forces that are exerted on the elongate coupling, is by forming the elongate coupling to be sufficiently stiff or such that it does not buckle to any significant degree when accelerated. In this regard, features discussed above in relation to the fifth aspect may be utilized by the subject sixth aspect as well.

A seventh aspect of the present invention is embodied in a microelectromechanical system that is fabricated utilizing an appropriate substrate. A lever assembly of any appropriate configuration is interconnected with this substrate such that at least part thereof is able to move both at least generally away from and toward the substrate, depending upon the direction of the force being exerted on the lever assembly. In this regard, the microelectromechanical system further includes an actuator assembly that is interconnected with the substrate for movement along a first path, a coupling that is appropriately interconnected (directly or indirectly) with this actuator assembly, and a connector that is attached to the lever assembly and that is also attached to the coupling. As such, movement of the actuator assembly relative to the substrate is transmitted to the lever assembly through the coupling and the connector.

The connector associated with the seventh aspect includes first and second connector ends and first and second flex link assemblies. The second connector end is located between the first connector end and the actuator assembly, and the coupling is attached to the connector at least at the first connector end. Both the first and second flex link assemblies extend between and interconnect the first and second connector ends. Finally, the connector includes a first interconnect that extends between and interconnects the first flex link assembly and one portion of the lever assembly, as well as a second interconnect that extends between and interconnects the second flex link assembly and another portion of the lever assembly.

Various refinements exist of the features noted in relation to the seventh aspect of the present invention. Further features may also be incorporated in the seventh aspect of the present invention as well. These refinements and additional features may exist individually or in any combination. The lever assembly may be characterized as an elevation structure, which may be of any appropriate configuration. The lever assembly may be of any configuration or structure that may be interconnected with the substrate so that at least a portion thereof is able to move at least generally away from or toward the substrate, depending upon the direction of the forces being exerted thereon. Any appropriate device (s) may be interconnected with this elevation structure (e.g., a mirror microstructure) and in any appropriate manner. In one embodiment, a cross beam extends between and interconnects laterally spaced portions of the lever assembly, and the connector is located somewhere between the location of this cross beam and the location where the lever assembly is movably interconnected with the substrate. That is, the first connector end is spaced from the cross beam in this embodiment, which may be characterized as a free end of the elevation structure. As such, the various features discussed above in relation to the first, second, and third aspects may be utilized by this seventh aspect as well, alone or in any combination.

Any way of movably interconnecting the lever assembly with the substrate may be utilized. Surface micromachining may be used to define at least part of the microelectromechanical system of the seventh aspect. In this case, the lever assembly may be interconnected with the substrate by a compliant flexure to allow a free end of the lever assembly to move at least generally away from or toward the substrate, depending upon the direction of movement of the actuator assembly. Each compliant flexure may be attached to a corresponding portion of the lever assembly and also attached to the substrate by an appropriate anchor.

The first and second connector ends and the first and second flex link assemblies of the connector that are utilized by the seventh aspect may be characterized as collectively defining a frame having a closed perimeter. This frame is at least generally rectangular in one embodiment. Other frame configurations/profiles may be appropriate (e.g., diamond-shaped). In any case, the first interconnect could thereby extend from one side of the connector frame to one portion of the lever assembly, while the second interconnect could extend from an opposite side of the connector frame to another portion of the lever assembly. Another way of characterizing the general configuration of the connector associated with the seventh aspect is that the first and second flex link assemblies may be disposed at least generally parallel with the coupling, while the first and second connector ends may be disposed at least generally transverse to the coupling. Other relative orientations may be appropriate.

Surface micromachining may be used to fabricate all or part of the microelectromechanical system of the seventh aspect of the present invention. In one embodiment, the connector is formed in a single level by surface micromachining. In another embodiment, the connector and a portion of the lever assembly that is interconnected with the connector are fabricated at a common level by surface micromachining. In yet another embodiment, a portion of the lever assembly that is interconnected with the connector is fabricated at one level by surface micromachining, while the connector is fabricated at a different level (e.g., "higher" or a level that is located further from the substrate) by surface micromachining.

There are a number of options in relation to how the coupling interfaces with the connector in the seventh aspect. In one embodiment, the coupling is attached to both of the first and second connector ends. Another embodiment has the sole interconnection between the coupling and the connector being at the first connector end. In this case, it may be desirable to have a supporting beam that extends between the first and second connector ends.

The first and second interconnects may be exposed to a torsional force by the application of a pulling or pushing force on the coupling in the case of the seventh aspect. This torsional force may place a tensile force on the entirety of the first and second flex link assemblies. In one embodiment, the first and second interconnects are disposed along a common reference axis that is at least generally transverse to the coupling. Other relative orientations may be utilized for the first and second interconnects. For instance, the first and second interconnects each may be disposed at an angle relative to a reference axis that is transverse to the coupling. Locationally, the first and second interconnects may each merge with the first and second flex link assemblies, respectively, at a location that is "midway" between the first and second connector ends. However, each of the first and second interconnects may merge with the first and second flex link assemblies, respectively, at other locations between the first and second connector ends. For instance, the first and second interconnects may merge with the first and second flex link assemblies, respectively, at different locations between the first and second connector ends. Stated another way and considering that the coupling defines a longitudinal dimension, the first and second interconnects may be longitudinally offset relative to each other.

The actuator assembly may move in first and second directions along the first path in the case of the seventh aspect. Movement in the first direction may be utilized to move the free end of the lever assembly at least generally away from the substrate. Movement in the second direction may be utilized to move the noted free end(s) at least generally toward the substrate. Part of the connector may be in compression and part of the connector may be in tension, regardless of whether the actuator assembly is moving in the first or second direction. Consider the case where the actuator assembly is moving in the first direction and which places the coupling in tension. In this case, that portion of the first and second flex link assemblies that is between the first connector end and where the first and second interconnects merge with the first and second flex link assemblies, respectively, may be in compression, while that portion of the first and second flex link assemblies that is between the second connector end and where the first and second interconnects merge with the first and second flex link assemblies, respectively, may be in tension. Now consider the case where the actuator assembly is moving in the second direction and which places the coupling in compression. In this case, that portion of the first and second flex link assemblies that is between the first connector end and where the first and second interconnects merge with the first and second flex link assemblies, respectively, may be in tension, while that portion of the first and second flex link assemblies that is between the second connector end and where the first and second interconnects merge with the first and second flex link assemblies, respectively, may be in compression.

One advantage of the configuration of the connector that is utilized by the seventh aspect is that it enhances one or more aspects of the manner in which the motion of the coupling is transferred to the lever assembly. As discussed above in relation to the fourth, fifth, and sixth aspects, certain configurations for the coupling also may provide one or more advantages in relation to the transfer of forces to an elevation structure. Therefore, any of the features discussed above in relation to one or more of the fourth, fifth, and sixth aspects of the present invention may be used alone or in any combination with the subject seventh aspect (and vice versa).

An eighth aspect of the present invention is embodied by a microelectromechanical system that is fabricated using an appropriate substrate. A lever assembly is interconnected with this substrate such that at least part thereof is able to move both at least generally away from and toward the substrate, depending upon the direction of the force being exerted on the lever assembly. In this regard, the microelectromechanical system further includes an actuator assembly that is interconnected with the substrate for movement along a first path, a coupling that is appropriately interconnected (directly or indirectly) with this actuator assembly, and a connector that is attached to the lever assembly, and that is also attached to the coupling. As such, movement of the actuator assembly relative to the substrate is transmitted to the lever assembly through the coupling and the connector. Part of the connector is in compression and part of the connector is in tension, regardless of whether the actuator assembly is moving in the first or second direction in the case of the eighth aspect.

Various refinements exist of the features noted in relation to the eighth aspect of the present invention. Further features may also be incorporated in the eighth aspect of the present invention as well. These refinements and additional features may exist individually or in any combination. One appropriate configuration for the connector includes first and second connector ends that are spaced in the direction of the elongation or length dimension of the coupling (e.g., longitudinally spaced). The second connector end is located between the first connector end and the actuator assembly, and the coupling is attached at least to at least the first connector end (e.g., the coupling may also be attached to the second connector end). The connector may also include first and second flex link assemblies that extend between the first and second connector ends on opposite sides of the coupling, and first and second interconnects that extend from the first and second flex link assemblies, respectively, to different portions of the lever assembly. Movement of the actuator assembly in the first direction may move part of the lever assembly (e.g., a free end(s) of the lever assembly) at least generally away from the substrate and may place the coupling in tension. In this case, that portion of the first and second flex link assemblies that is between the first connector end and where the first and second interconnects merge with the first and second flex link assemblies, respectively, may be in compression, while that portion of the first and second flex link assemblies that is between the second connector end and where the first and second interconnects merge with the first and second flex link assemblies, respectively, may be in tension. Movement of the actuator assembly in the second direction may move part of the lever assembly at least generally toward the substrate (e.g., a free end(s) of the lever assembly) and may place the coupling in compression. In this case, that portion of the first and second flex link assemblies that is between the first connector end and where the first and second interconnects merge with the first and second flex link assemblies, respectively, may be in tension, while that portion of the first and second flex link assemblies that is between the second connector end and where the first and second interconnects merge with the first and second flex link assemblies, respectively, may be in compression. Each of features that were discussed above as being relevant to the seventh aspect also may be utilized by this eighth aspect as well, alone and in any combination.

A ninth aspect of the present invention is embodied in a microelectromechanical system that is fabricated using an appropriate substrate. A lever assembly is interconnected with this substrate such that at least part thereof is able to move both at least generally away from and toward the substrate, depending upon the direction of the force being exerted on the lever assembly. In this regard, the microelectromechanical system further includes an actuator assembly that is interconnected with the substrate for movement along a first path, a tether or coupling that is appropriately interconnected (directly or indirectly) with this actuator assembly, and a connector that is attached to both the lever assembly and the coupling. As such, movement of the actuator assembly relative to the substrate is transmitted to the lever assembly through the coupling and the connector.

Various refinements exist of the features noted in relation to the ninth aspect of the present invention. Further features may also be incorporated in the ninth aspect of the present invention as well. These refinements and additional features may exist individually or in any combination. In one embodiment, the connector of the eighth aspect includes at least one flex link or a structure that will flex more than the lever assembly when exposed to the types of forces exerted on the connector during normal operation. In another embodiment, at least one flex link of the connector is placed in compression and at least one flex link of the connector is placed in tension, regardless of whether the coupling is being placed in tension or compression by a movement of the actuator assembly. Stated another way, at least one flex link of the connector is placed in compression and at least one flex link of the connector is placed in tension, regardless of which direction the actuator assembly is moving relative to the substrate. In yet another embodiment, at least one flex link of the connector on each side of the coupling is placed in compression and at least one flex link of the connector on each side of the coupling is placed in tension, regardless of which direction the actuator assembly is moving relative to the substrate.

DESCRIPTION OF THE DRAWINGS

FIG. 3C is a plan view of another variation of the lift assembly of FIG. 3A;

FIG. 3D is a plan view of another variation of the lift assembly of FIG. 3A;

FIG. 3E is a plan view of another variation of the lift assembly of FIG. 3A;

DETAILED DESCRIPTION

Figure 1:
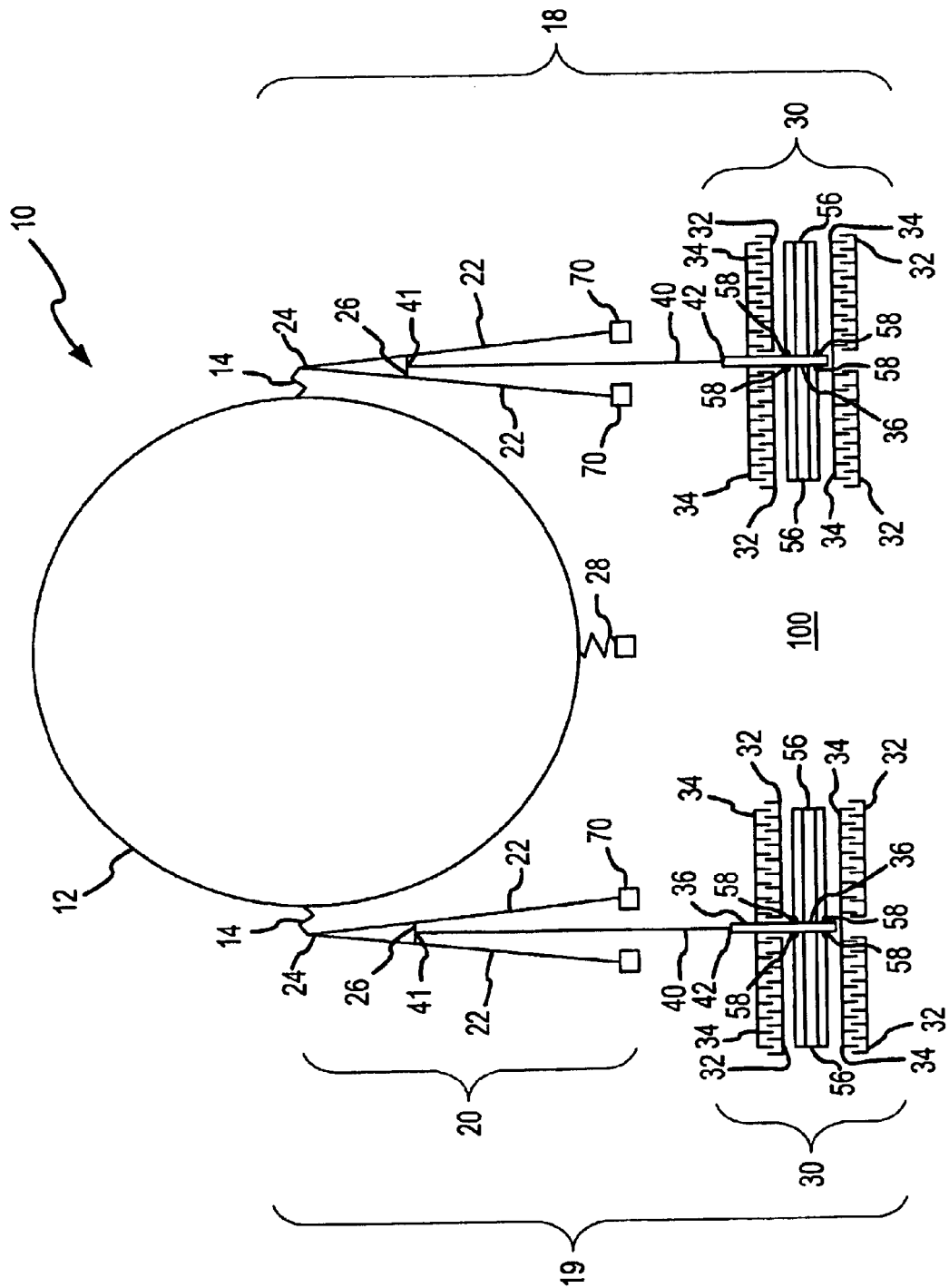
FIG. 1 shows a schematic plan view of one embodiment of an optical system with a pair of lift assemblies that are configured for displacement multiplication.

The present invention will now be described in relation to the accompanying drawings which at least assist in illustrating its various pertinent features. Surface micromachined microstructures are the general focus of the present invention. Various surface micromachined microstructures are disclosed in U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED", the entire disclosures of which are incorporated by reference in their entirety herein.

Surface micromachining generally entails depositing alternate layers of structural material and sacrificial material using an appropriate substrate which functions as the foundation for the resulting microstructure, which may include one or more individual microstructures. The term "substrate" as used herein means those types of structures that can be handled by the types of equipment and processes that are used to fabricate micro-devices on, within, and/or from the substrate using one or more micro photolithographic patterns. An exemplary material for the substrate is silicon. Various patterning operations (collectively encompassing the steps of masking, etching, and mask removal operations) may be executed on one or more of these layers before the next layer is deposited so as to define the desired microstructure. After the microstructure has been defined in this general manner, at least some of the various sacrificial layers are removed by exposing the microstructure and the various sacrificial layers to one or more etchants. This is commonly called "releasing" the microstructure from the substrate, typically to allow at least some degree of relative movement between the microstructure and the substrate. The term "sacrificial layer", therefore, means any layer or portion thereof of any surface micromachined microstructure that is used to fabricate the microstructure, but which does not exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). Exemplary materials for the structural layers of the microstructure include doped or undoped polysilicon and doped or undoped silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

Only those portions of a microelectromechanical system that are relevant to the present invention will be described herein. There may, and typically will, be other microstructures that are included in a given microelectromechanical system. As used herein, the term "compliant" or "flexible" is defined to mean a first portion of a microstructure that is less stiff in comparison with an attached second portion of that microstructure, such that the compliant or flexible first portion of the microstructure will bend or flex significantly more than the 'stiffer' second portion upon application of a force.

Referring now to FIG. 1, there is shown a top view of an exemplary MEM optical system 10 that is fabricated on a substrate 100. Although only one optical system 10 is shown, it will be appreciated that a particular chip may contain multiple sets of these MEM optical systems 10, along with other relevant componentry. As shown, the exemplary system 10 includes a reflective microstructure 12 (e.g., mirror) and two sets of positioning microstructures 18, 19 which each include an electrostatic actuator 30, a lift assembly or an A-frame structure 20, and a coupling or tether 40. In addition, a passive member 28 attaches a peripheral edge of the reflective microstructure 12 to the substrate 100 such that the reflective microstructure 12 may pivot about this location as well. In operation, the positioning microstructures 18, 19 may be used independently or in concert to lift and/or tilt the reflective microstructure 12 relative to the substrate 100 for the desired optical application. Any way of interconnecting the mirror microstructure 12 with one or more positioning microstructures 18, 19 and/or the substrate 100 may be utilized to achieve a desired response/movement of the mirror microstructure 12 relative to the substrate 100.

Each actuator microstructure 30 includes several stationary combs 32 that are fixed to the substrate 100 and several moveable combs 34 that are attached to a moveable frame 36. The moveable frame 36 is supported above the substrate 100 by a folded actuator support spring 56 that is anchored to the substrate 100 at four anchor points 58 to permit lateral movement of the frame 36 relative to the substrate 100. "Lateral" or the like herein means at least generally parallel with respect to the substrate 100 or a plane that at least generally contains the substrate 100. Upon application of a control voltage via electrical interconnects (not shown) across the combs 32, 34, the moveable combs 34 are pulled laterally towards the stationary combs 32, thereby moving the frame 36 laterally relative to the substrate 100. The amount of lateral movement corresponds with the magnitude of the actuation voltage applied. As the movable frame 36 moves laterally, the actuator support springs 56 are moved from their static condition and store a return potential energy equal to their spring constant times this lateral displacement. Once the application of the control voltage is removed from the actuator combs 32 and 34, the actuator support springs 56 return the frame 36 back to its static position. Any type of actuator microstructure may be utilized in place of the actuator 30 (electrostatic comb actuator, a capacitive-plate electrostatic actuator, a thermal actuator, a movable-electrode electrostatic actuator, a piezoelectric actuator, an electromagnetic actuator and a magnetic actuator), and any manner of movably interconnecting the same with the substrate 100 may be utilized as well in relation to any positioning microstructure 18, 19 that may be used by the optical system 10. Moreover, it should be appreciated that movement of the actuator 30 in either direction may be accomplished in any appropriate manner. For instance, movement of the actuator 30 in a given direction may be via an active force in the sense that it is in response to an appropriate signal, may be via a passive force in the sense that it utilizes a stored spring force or the like, or a combination thereof.

The frame 36 is coupled to a coupling microstructure, connector member, or "tether" 40 which in turn is connected to the A-frame structure 20. A first end 41 of the tether 40 couples with a crossbeam 26 on the A-frame structure 20 that connects the individual legs or elevation members 22 of the A-frame structure 20. Though shown near the apex or free end 24 of the A-frame structure 20, the crossbeam 26 is in fact spaced from this apex 24. Generally, the crossbeam 26 may be disposed at any location that is somewhere between the apex 24 and base 70 of the A-frame structure 20, as will be more fully discussed below. The A-frame structure 20 is compliantly anchored at its base 70 to the substrate 100 and is connected to the reflective microstructure 12 by an extension arm 14. Where tether 40 attaches to the A-frame structure 20 in this general manner provides what may be characterized as a displacement multiplication system.

Any way of interconnecting the A-frame structure 20 and the mirror microstructure 12 may be utilized by the positioning microstructures 18, 19. Moreover, any appropriate configuration of a microstructure that may be moved at least generally away from or toward the substrate 100 may be used by either of the positioning microstructures 18, 19, as well as any appropriate manner of movably interconnecting such a microstructure with the substrate 100 (e.g., the tether 40 could be attached to a single beam that is anchored to the substrate 100 at one location, and that has an end that is spaced from this location and that is movable away from the substrate 100).

Figure 2:
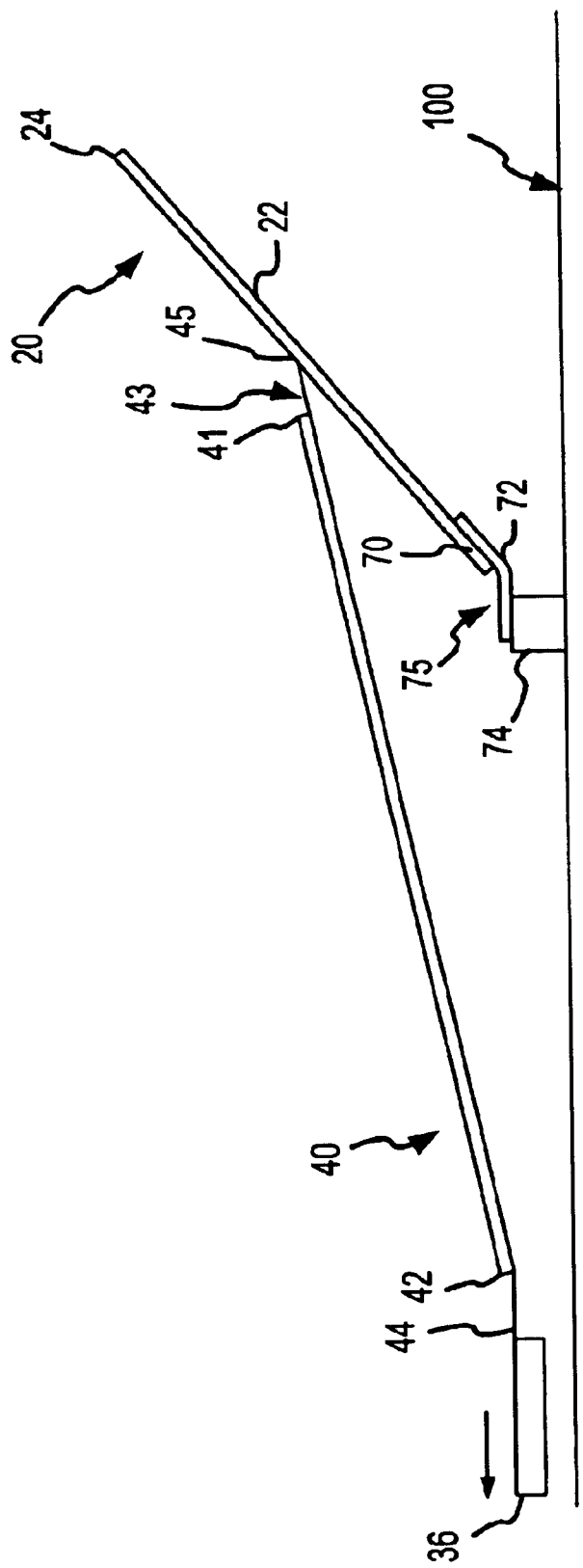
FIG. 2 shows a side view of one of the lift assemblies of FIG. 1, in an elevated position away from the plane of the substrate.

Referring to FIG. 2, there is shown a side view of an A-frame structure 20 being moved away from the substrate 100 by a displacement of the tether 40 that is in turn provided by a lateral movement of the corresponding actuator microstructure 30. As shown in FIG. 2, only one elevation member 22 is visible. Because the A-frame structure 20 is compliantly anchored to the substrate 100 at its base 70, when the actuator microstructure 30 moves laterally relative to the substrate 100 in one direction, the apex 24 of the A-frame structure 20 moves relative to and at least generally away from the substrate 100 along an at least generally arcuate path to apply a force to the mirror microstructure 12 (not shown in FIG. 2), to in turn move the reflective microstructure 12 at least generally away from the substrate 100 as well (e.g., at least where it is attached to the A-frame structure 20). It should be appreciated that a movement of the actuator microstructure 30 in the opposite direction will then move the apex 24 of the A-frame structure 20 at least generally toward the substrate 100. In essence, the A-frame structure 20 acts as a lever arm. The longer the lever arm comprised by elevation members 22 of the A-frame structure 20, the greater the amount of upward displacement of the mirror microstructure 12 for a given upward angular displacement of the elevation members 22.

One end of each elevation member 22 is connected to the substrate 100 with what may be characterized as a hinge member 75, which contains an anchor point or post 74 and a flexible member 72. This anchor point 74 may pass through one or more layers of structural material to provide a secure attachment to the substrate 100. The flexible member 72 attaches each elevation member 22 to its anchor point 74 and thus allows the A-frame structure 20 to be moved out of the plane of the substrate 100. In order for the bending which results from moving the A-frame structure 20 away from the substrate 100 to be substantially isolated to the flexible members 72, the flexible members 72 may have a lower resistance to bending (i.e., moment of inertia) than the structures they connect. The moment of inertia for a structure with a rectangular cross section is $I=bh^3/12$, where "h" is the height of the rectangle perpendicular to the bending axis and "b" is the width of the rectangle parallel with the bending axis. Therefore, a structure's stiffness is a cubic function of the height or thickness of that structure in the direction perpendicular to the bending axis. Therefore, one way to substantially isolate bending to the flexible members 72 is to form the flexible members 72 such that their thickness perpendicular to the desired bending axis is significantly less than corresponding thickness about the same axis of the structures they connect (e.g., the anchor points 74 and elevation members 22).

The crossbeam 26, which connects the elevation members 22 at a point between the A-frame's apex 24 and base 70, allows lateral displacements from the actuator 30 (or any other appropriate motive source) to act upon both elevation members 22 simultaneously. Additionally, the crossbeam 26 allows for attaching the first end 41 of the tether 40 to both elevation members 22 at a point other than the A-frame structure's apex 24 such that a range of multiplied displacements of the apex 24 away from the substrate 100 may be realized in response to a lateral movement of the actuator microstructure 30. As noted above, A-frame structure 20 is, in effect, a lever arm in which a greater amount of vertical displacement with respect to the substrate 100 will be produced at points further from the pivot point (i.e., the A-frame's base 70) for a given angular displacement of the A-frame structure 20. Accordingly, by attaching the first end 41 of the tether 40 closer to the base 70 of the A-frame structure 20, a small lateral movement of the tether 40 will result in a larger angular displacement of the A-frame structure 20 and its apex 24 relative to the substrate 100.

Figure 3A:
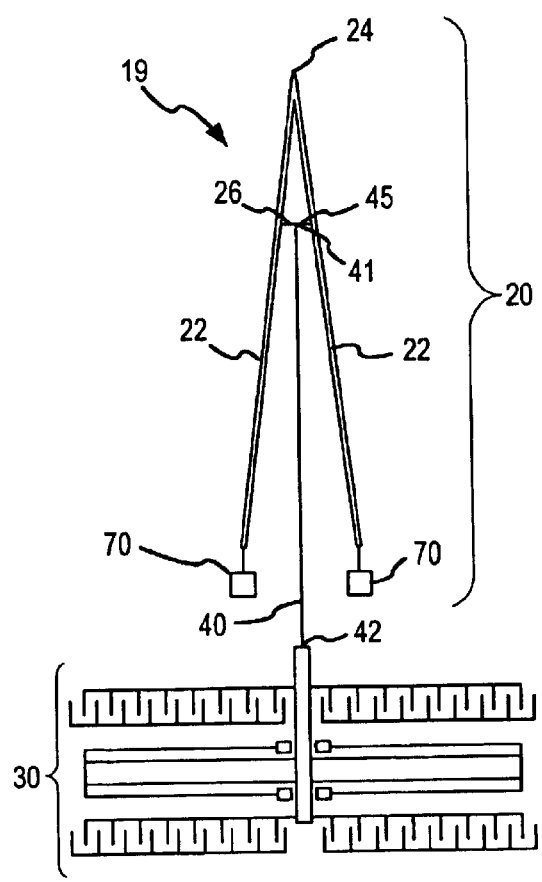
FIG. 3A is an enlarged plan view of one of the lift assemblies of FIG. 1.
Figure 3B:
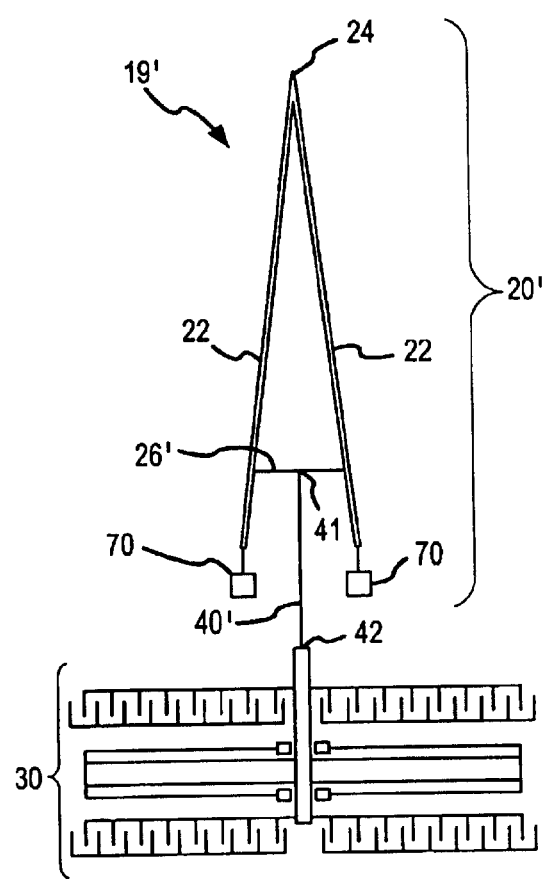
FIG. 3B is an enlarged plan view of a variation of the lift assembly of FIG. 3A that provides yet further multiplied displacement in relation to the FIG. 3A embodiment.

FIG. 3A is an enlarged plan view of the positioning microstructure 19 of FIG. 1, while FIG. 3B is an enlarged plan view of a variation of this positioning microstructure 19. Corresponding components are similarly identified in FIGS. 3A and 3B, but a "single prime" designation is utilized in FIG. 3B as being indicative of the existence of at least one structural difference from the embodiment of FIG. 3A. Generally, the horizontal beam 26 in FIG. 3A connects the A-frame elevation members 22 at a location that is spaced from the apex 24 of the A-frame structure 20 by a first longitudinal distance. The horizontal beam 26' in FIG. 3B connects the A-frame elevation members 22 at a location that is spaced from the apex 24 of the A-frame structure 20 at second longitudinal distance that is greater than the above-noted first longitudinal distance. That is, the crossbeam 26' in the embodiment of FIG. 3B is positioned closer to the base 70 than the crossbeam 26 in the embodiment of FIG. 3A. Therefore, the same magnitude of lateral movement of the actuator microstructure 30 will produce a greater vertical displacement in the case of the embodiment of FIG. 3B than in the embodiment of FIG. 3A. This is depicted by a comparison of FIGS. 4A and 4B.

Various other configurations of positioning microstructures may be appropriate. FIG. 3C illustrates an elevation structure 476. The elevation structure 476 includes a pair of lower legs or levers 478a, 478b that are symmetrically disposed relative to a tether 490. One end 496a, 496b of these lower legs 478a, 478b is movably interconnected with a substrate 498 in the same manner as the legs 22 of the A-frame structure 20. The lower legs 478a, 478b are joined at an intersection 480, which is at an intermediate location between the ends 496a, 496b of the lower legs 478a, 478b (which collectively define one end of the elevation structure 476) and a free end 494 of the elevation structure 476. A crossbeam 484 extends between and interconnects the lower legs 478a, 478a between the ends 496a, 496b and the intersection 480. A single upper leg 482 extends from this intersection 480 to the free end 494 of the elevation structure 476. A pair of appropriate and spaced interconnects 486 extend from the upper leg 482 to a reflective microstructure 488. Movement of the elevation structure 476, and thereby movement of the reflective microstructure 488, is accomplished by transmitting an appropriate actuation force to the elevation structure 476 through a tether 490. One end 492 of the tether 490 is attached to the crossbeam 484 of the elevation structure 476, while its opposite end (not shown) is attached (directly or indirectly) with an appropriate actuator assembly (i.e., one or more actuators that are appropriate for a microelectromechanical application). As such, the actuation force is exerted on the elevation structure 476 by the tether 490 at a location that is spaced from its free end 494.

FIG. 3D illustrates a variation of the elevation structure 476 of FIG. 3C. Therefore, the same reference numerals are used to identify the corresponding structures, along with a "single prime" designation. The elevation structure 476' includes a pair of lower legs or levers 478a', 478b' that are symmetrically disposed relative to the tether 490. One end 496a', 496b' of these lower legs 478a', 478b' is movably interconnected with the substrate 498 in the same manner as the legs 22 of the A-frame structure 20. The lower legs 478a', 478b' are joined at an intersection 480', which is at an intermediate location between the ends 496a', 496b' of the lower legs 478a', 478b' (which collectively define one end of the elevation structure 476') and a free end 494' of the elevation structure 476'. A single upper leg 482' extends from this intersection 480' to the free end 494' of the elevation structure 476'. A pair of appropriate and spaced interconnects 486' extend from the upper leg 482' to the reflective microstructure 488. Movement of the elevation structure 476', and thereby movement of the reflective microstructure 488, is accomplished by transmitting an appropriate actuation force to the elevation structure 476' through the tether 490. One end 492 of the tether 490 is attached to the upper leg 482' (i.e., at any location between the free end 494' and the intersection 480' of the elevation structure 476), while its opposite end (not shown) is attached (directly or indirectly) with an appropriate actuator assembly (i.e., one or more actuators that are appropriate for a microelectromechanical application). As such, the actuation force is exerted on the elevation structure 476' by the tether 490 at a location that is spaced from its free end 494'.

FIG. 3E illustrates another variation of the elevation structure 476 of FIG. 3C. Therefore, the same reference numerals are used to identify the corresponding structures, along with a "double prime" designation. The elevation structure 476" includes a pair of lower legs or levers 478a", 478b" that are disposed in asymmetrical relation to a tether 490. One end 496a", 496b" of these lower legs 478a", 478b" is movably interconnected with a substrate 498 in the same manner as the legs 22 of the A-frame structure 20. The lower legs 478a", 478b" are joined at an intersection 480", which is at an intermediate location between the ends 496a", 496b" of the lower legs 478a", 478b" (which collectively define one end of the elevation structure 476") and a free end 494" of the elevation structure 476". A crossbeam 484" extends between and interconnects the lower legs 478a", 478a" between the ends 496a", 496b" and the intersection 480". A single upper leg 482" extends from this intersection 480" to the free end 494" of the elevation structure 476". This upper leg 482" includes a first portion that extends linearly from the intersection 480" in parallel relation to the tether 490 (and in axial alignment with the leg 478b"), and a second portion that extends in linear fashion at least generally in the direction of the reflective microstructrure 488 (i.e., the first and second portions of the upper leg 482" are disposed at an angle to each other). A pair of appropriate and spaced interconnects 486" extend from the upper leg 482" to a reflective microstructure 488. Movement of the elevation structure 476", and thereby movement of the reflective microstructure 488, is accomplished by transmitting an appropriate actuation force to the elevation structure 476" through the tether 490. One end 492 of the tether 490 is attached to the crossbeam 484" of the elevation structure 476", while its opposite end (not shown) is attached (directly or indirectly) with an appropriate actuator assembly (i.e., one or more actuators that are appropriate for a microelectromechanical application). As such, the actuation force is exerted on the elevation structure 476" by the tether 490 at a location that is spaced from its free end 494".

Figure 4A:
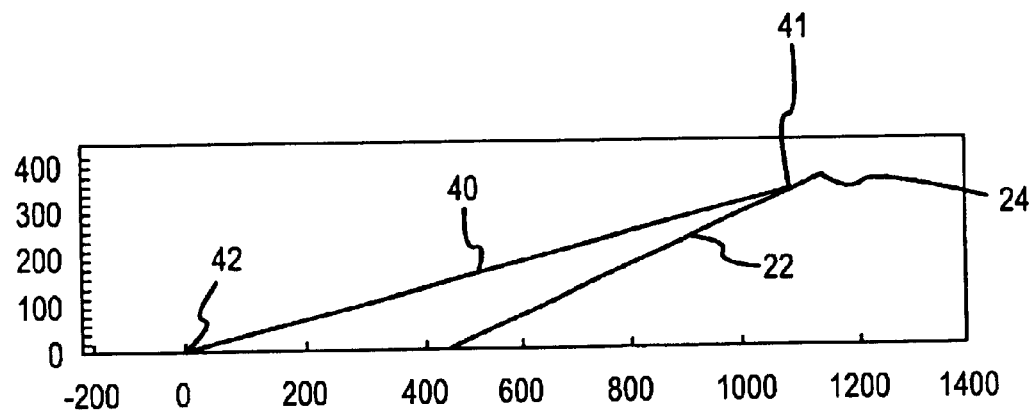
FIGS. 4A and 4B show a schematic side view of the operation of the lift assemblies of FIGS. 3A and 3B respectively.
Figure 4B:
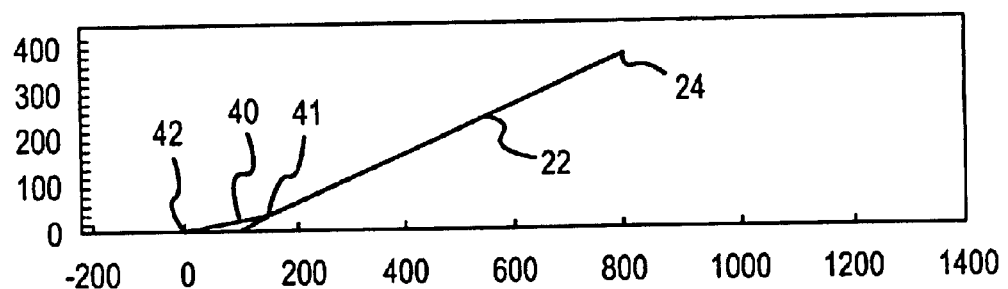

FIGS. 4A and 4B show a side view of the operation of the positioning microstructures 19, 19' of FIGS. 3A and 3B, respectively (not to scale). As shown in FIG. 4A, when the first end 41 of the tether 40 is connected to the A-frame structure 20 a relatively short distance from the apex 24, the second end 42 of the tether 40 (attached to a motive source such as the actuator microstructure 30 on the substrate 100) must be moved approximately 35 microns to the left to produce the vertical displacement of apex 24 shown in FIG. 4A. In contrast, when the first end 41 of the tether 40' is connected nearer the base 70 of the A-frame structure 20' (see FIGS. 3B and 4B), this same vertical displacement of the apex 24 may be achieved by moving the second end 42 of the tether 40' only 5 microns to the left. By selecting the appropriate geometries between the microstructures and selectively attaching the first end 41 of the tether 40 to the A-frame structure 20 at a certain location that is between the apex 24 and the base 70, the lateral displacement provided by an actuator 30 can produce a range of displacements of a lever arm type lift system to elevate a microstructure to a desired height above a substrate 100 without the use of a displacement multiplier.

Figure 5:
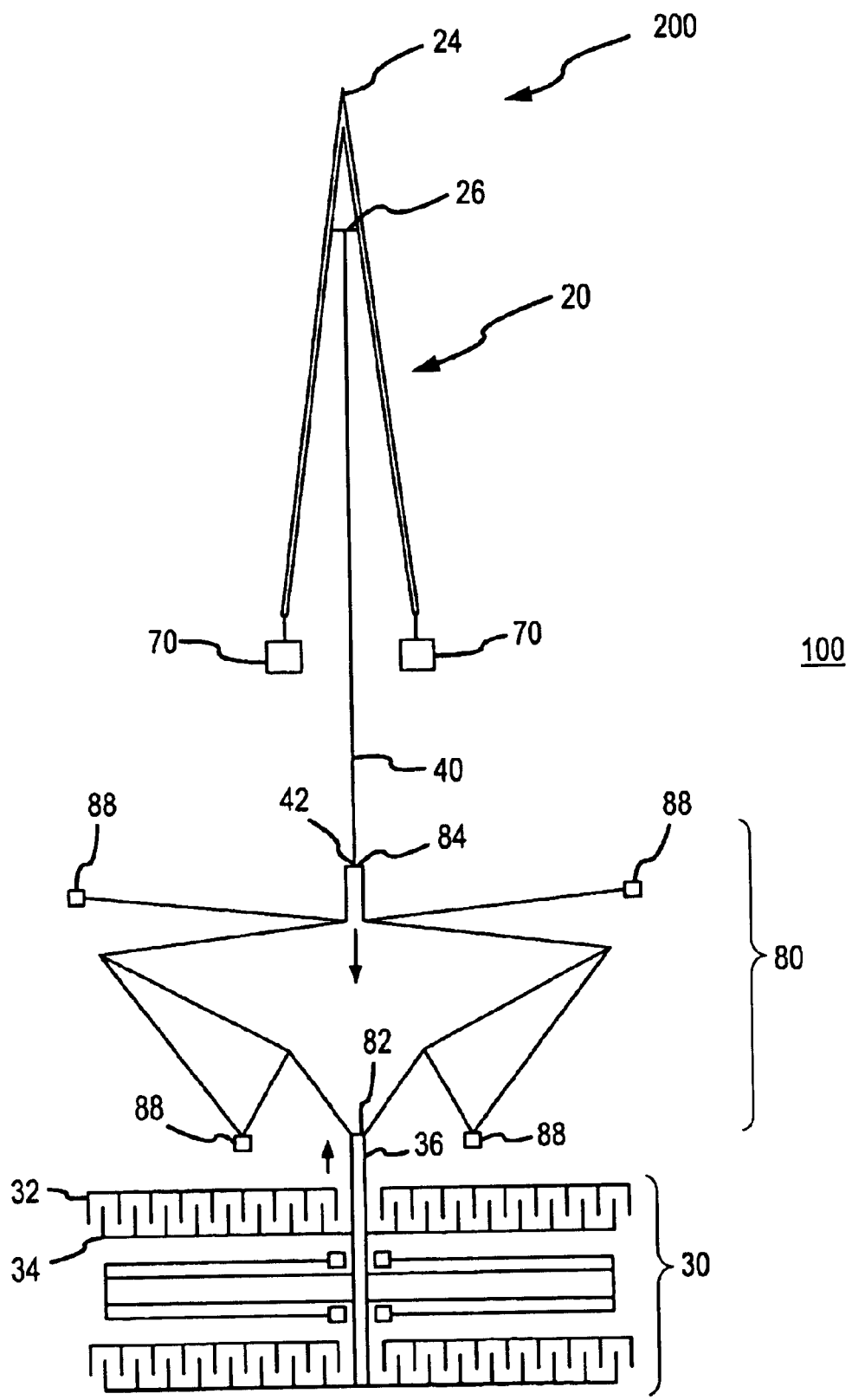
FIG. 5 shows a schematic plan view of another embodiment of an optical system with a lift assembly that is configured for displacement multiplication.

Referring to FIG. 5, there is shown a schematic plan view of another embodiment of a positioning microstructure. The positioning microstructure 200 of FIG. 5 is configured similarly to the systems in FIGS. 3A and 3B. However, the positioning microstructure 200 shown in FIG. 5 includes a displacement multiplier 80 that is disposed between the actuator 30 and the tether 40. Any configuration may be utilized for the displacement multiplier 80. In this configuration, an input end 82 of the displacement multiplier 80 is connected to the movable frame 36 of the actuator microstructure 30, while an output end 84 of the displacement multiplier 80 is connected to the second end 42 of the tether 40. The displacement multiplier 80 is interconnected with the substrate 100 by a plurality of appropriately positioned anchors 88. Generally, the displacement multiplier 80 may be configured such that a first magnitude of lateral movement of the input end 82 will produce a second magnitude of lateral movement of the output end 84 that is different from the first magnitude by a predetermined pivoting of the various beam microstructures that define the displacement multiplier 80. However, the displacement multiplier 80 may provide one-for-one movement between the input section 82 and the output section 84 as well.

Figure 6A:
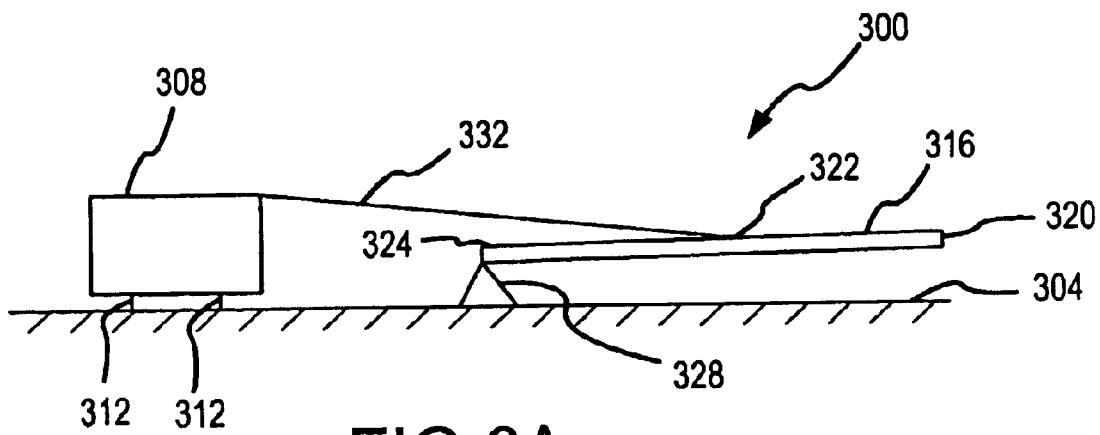
FIG. 6A is a side view of a microelectromechanical system with one embodiment of a displacement multiplication system.
Figure 6B:
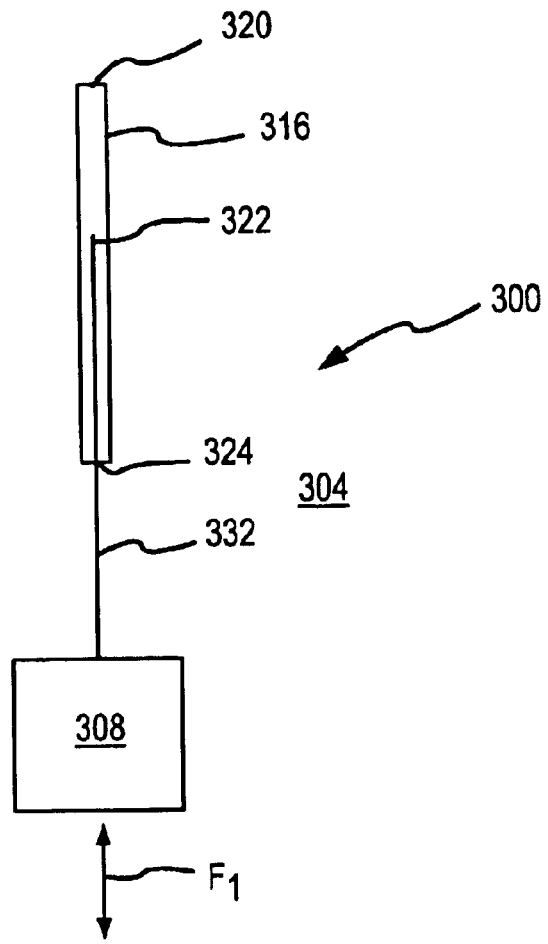
FIG. 6B is a top view of the system of FIG. 6A.
Figure 6C:
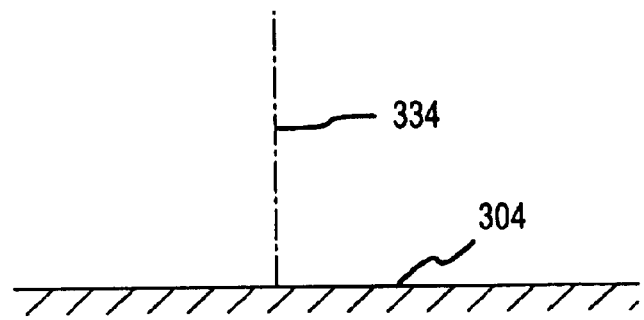
FIG. 6C is an end view of a plane of motion of a lever of the microelectromechanical system of FIG. 6A.

The general principles of the above-described optical system in relation to the manner of lifting and/or pivoting the mirror microstructure described therein are embodied by the microelectromechanical system 300 of FIGS. 6A–C. The microelectromechanical system 300 is fabricated using an appropriate substrate 304. One component of the microelectromechanical system 300 is an actuator assembly 308 that is interconnected with the substrate 304 for movement relative thereto in any appropriate manner, such as by one or more compliant interconnects 312 or the like. The actuator assembly 308 utilizes one or more actuators of any appropriate type.

Another component of the microelectromechanical system 300 is a lever 316. This lever 316 may be in any appropriate configuration (e.g., defined by a single beam; defined by a plurality of interconnected beams), and includes a free end 320 that is movable both at least generally away from and at least generally toward the substrate 304 in a manner that is at least generally about a location 324. This location 324 corresponds with an end of the lever 316 that is opposite the free end 320 of the lever 316 in the illustrated embodiment, although such need not be the case (e.g., the location 324 could be at some intermediate location between the opposing ends of the lever 316). The location 324 will typically coincide with where an anchor 328 extends between and interconnects the lever 316 with an underlying structure, such as the substrate 304. In any case, the actuator assembly 308 is interconnected with the lever 316 at a location 322 on the lever 316 by a coupling or tether 332. Any appropriate structure may be utilized by the coupling or tether 332, including a single beam of sorts or a plurality of beams. Moreover, a displacement multiplier or the like may be utilized (e.g., similar to the FIG. 5 embodiment).

Generally, the coupling 332 attaches to the lever 316 at the location 322, which may be disposed or located anywhere between the location of the free end 320 of the lever 316 and the location 324 about which the free end 320 of the lever 316 at least generally moves relative to the substrate 304. Since the resultant vector $F_1$ of the forces that are exerted on the coupling 332 by a movement of the actuator assembly 308 relative to the substrate 304 is at least generally collinear with the longitudinal extent of the lever 316, the free end 320 of the lever 316 moves along an at least generally arcuate path and within a reference plane 334 that is at least generally perpendicular to the substrate 304. This is the type of motion utilized by the above-described embodiments. Different types of motion may be realized, and such may be used by the above-described embodiments as well.

Figure 6D:
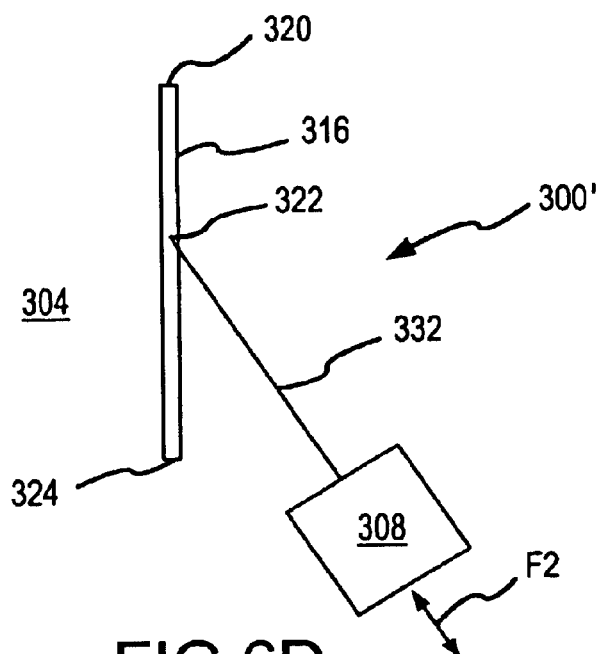
FIG. 6D is a variation of the displacement multiplication system of the microelectromechanical system of FIG. 6A.
Figure 6E:
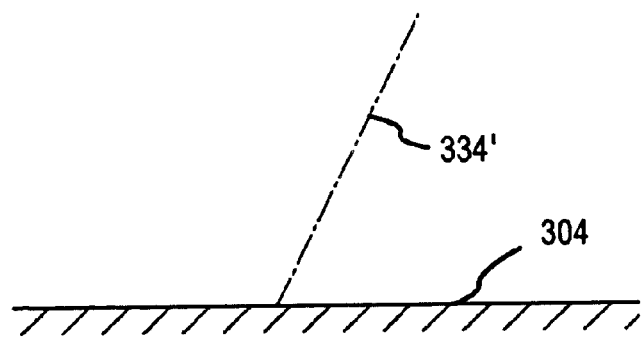
FIG. 6E is an end view of a plane of motion of a lever of the microelectromechanical system of FIG. 6D.

One embodiment where the motion of the free end 320 of the lever 316 is not within a reference plane 334 that is at least generally perpendicular to the substrate 304 is illustrated in FIGS. 6D–E. Corresponding components of the embodiments of FIGS. 6A–C and 6D–E are similarly identified, although a single prime designation is used in FIGS. 6D–E to indicate that there is at least one difference between these two embodiments. Generally, the primary distinction between the two embodiments is that the microelectromechanical system 300' of FIGS. 6D–E disposes the actuator assembly 308 in a position relative to the lever 316 such that the resultant vector $F_2$ of the forces that are exerted on the coupling 332 by a movement of the actuator assembly 308 relative to the substrate 304 are not collinear with the longitudinal extent of the lever 316. As such, although the free end 320 of the lever 316 still moves along an at least generally arcuate path relative to the substrate (both at least generally away from and toward the substrate 304, depending upon the direction of the motion of the actuator assembly 308), it does so within a reference plane 334' that is disposed at an angle relative to the substrate 304 that is anything other than perpendicular to the substrate 304. Other configurations/arrangements may allow the free end 320 of the lever 316 to move both away from and toward the substrate 304 other than within a plane that is perpendicular to the substrate 304, and such may be utilized by the microelectromechanical system 300' of FIGS. 6D–E.

Figure 7:
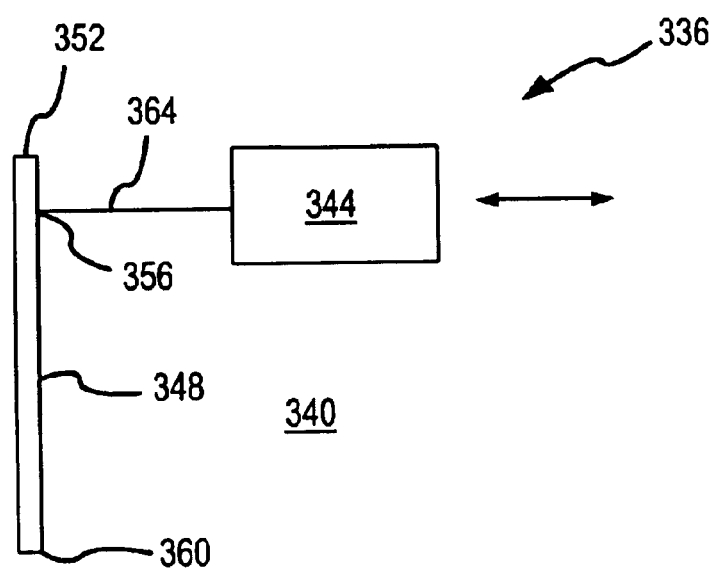
FIG. 7 is a top view of a microelectromechanical system with another embodiment of a displacement multiplication system.

Another embodiment of a microelectromechanical system that produces a movement within yet a different reference plane is illustrated in FIG. 7. The microelectromechanical system 336 of FIG. 7 is fabricated using an appropriate substrate 340. One component of the microelectromechanical system 336 is an actuator assembly 344 that is interconnected with the substrate 340 for movement relative thereto in any appropriate manner and by any appropriate technique. The actuator assembly 344 may a utilize one or more actuators of any appropriate type.

Another component of the microelectromechanical system 336 is a lever 348. This lever 348 may be in any appropriate configuration (e.g., defined by a single beam; defined by a plurality of interconnected beams), and includes a free end 352 that is movable relative to the substrate 304 at least generally about a location 360. This location 360 corresponds with an end of the lever 348 that is opposite the free end 352 in the illustrated embodiment, although such need not be the case (e.g., the location 360 could be at some intermediate location between the opposing ends of the lever 348). The location 360 will typically correspond with where the lever 360 in structurally interconnected with an underlying structure, such as the substrate 340 (e.g., corresponding with an anchor or pin to the substrate 340).

The actuator assembly 344 is interconnected with the lever 348 at a location 356 on the lever 316 by a coupling or tether 364. Any appropriate structure may be utilized by the coupling or tether 364, including a single beam of sorts or a plurality of beams and a displacement multiplier or the like (e.g., similar to the FIG. 5 embodiment). Generally, the coupling 364 attaches to the lever 348 at the location 356, which may be disposed or located anywhere between the location of the free end 352 of the lever 348 and the location 360 about which the free end 352 of the lever 348 at least generally moves relative to the substrate 304. The microelectromechanical system 336 is configured such that the free end 352 of the lever 348 moves within a reference plane that is at least generally parallel with that of the substrate 304 (e.g., in at least generally horizontal relation). Other configurations that allow the free end 352 to move in this general manner may be used by the microelectromechanical system 336.

Each of the above-noted tethers or couplings are subjected to external forces from a number of sources during operation of the microelectromechanical system. There is of course the actuation force that is generated and transmitted to the tether to move the tether in a certain manner. This actuation force may be a cumulative force of the force exerted on the tether by a movement of the actuator/actuator assembly, as well as a spring force from one or more sources of the microelectromechanical system. The actuation force will at least at some point in time expose the tether to a tensile force when the actuator or actuator assembly interconnected therewith moves in one direction, and at least at some point in time expose the tether to a compressive force when this actuator/actuator assembly moves in the opposite direction (whether actively via receipt of an actuation signal by the actuator/actuator assembly, passively via a stored spring force or the like, or a combination thereof). Inertial forces (e.g., from the mass of the lever and the microstructure that moves in response to the movement of the lever) will also be generated and transmitted to the tether, for instance in response to the manner in which the motion of the actuator/actuator assembly is initiated/maintained and in the manner in which the motion of the actuator/actuator assembly is terminated. In at least certain applications (e.g., to achieve a desired switching speed for an optical application; to have a more controlled response of a load that is interconnected with a lever that is moved via a movement of the tether or coupling), it may be desirable to configure such a tether or coupling to have a stiffness such that there is not any significant flexing or buckling of the tether or coupling when exposed to at least a certain magnitude of external forces. This level of stiffness may be required, even when such tethers or couplings are incorporated into a microelectromechanical system so as to have a length in excess of about 1,300 microns, where the "x component" of the compressive external force that is exerted on the tether or coupling microstructure by a movement of an actuator/actuator assembly relative to the substrate is in excess of about 20 $\mu$N, or both. The "x component" means along an axis that is at least generally parallel with the general lateral extent of the substrate.

One way to characterize the above-noted type of stiffness is that such a tether or coupling has a buckle strength between its opposite ends that is greater than a maximum "x component" of the force that will typically be exerted on the tether or coupling by a movement of the actuator assembly so as to place the tether or coupling in compression during operation of the corresponding microelectromechanical system. Another way to characterize such a stiffness is that the movement, speed, acceleration, or any combination thereof, of a free end of the lever (or elevator structure) relative to the substrate is at least substantially solely controlled by external forces that are exerted on the tether or coupling. That is, for this characterization, no significant portion of the forces that cause a free end of the lever to move relative to the substrate, at a time when the tether or coupling is under compression, are due to any internal forces that may exist within the tether or coupling. Yet another way to characterize this type of stiffness for the tether or coupling is that the tether or coupling undergoes at least substantially no elastic deformation when placed in compression by exposure to external forces from any source or combination of sources. Although this "stiff" tether feature will now be described in more detail in relation to the embodiment of FIGS. 1–2, these fundamentals are equally applicable to any of the embodiments described herein if desired/required by a particular application.

Referring back now to the embodiment of FIGS. 1 and 2, the tether 40 again interconnects the actuator's movable frame 36 to the beam 26 interconnecting the elevation members 22 of the A-frame structure 20. This tether 40 is used to transfer the displacement from the actuator 30 to the A-frame structure 20, which, in turn, produces the angular displacement of the A-frame structure 20 that moves the reflective microstructure 12 relative to the substrate 100. As will be appreciated, the actuation force that is applied by the movable frame 36 of the actuator 30 to the second end 42 of the tether 40 for lifting the reflective microstructure 12 away from the substrate 100 is a pulling force, which is represented as a tensile force in the tether 40. However, upon reduction of the electrical voltage across the actuator combs 32 and 34, the actuator support springs 56 connected between the movable frame 36 and the substrate 100 apply a pushing or compressive force to the tether 40 since the opposite end 41 of the tether 40 is structurally interconnected with the reflective microstructure 12. This is also an actuation force. Other spring forces may be exerted on the tether 40 as well and contribute to the actuation force that is exerted on the tether 40. For instance, the compliant member 43 between the tether 40 and the movable frame 36 of the actuator 30, the compliant member 43 between the tether 40 and the A-frame structure 20, and/or the flexible member 72 between the elevation members 22 and the substrate 100 may apply a spring force to the tether 40 that is directed to move the tether 40 relative to the substrate 100. It should be appreciated that an actuation force that moves the apex of the A-frame structure 20 toward the substrate 100 could of course be applied to the tether 40 by an actuated movement of the actuator 30, or some combination of active and passive forces. Inertial forces will be exerted on the tether 40 as a result of the mass of the A-frame structure 20 and the reflective microstructure 12 that is interconnected therewith, regardless of the direction of motion of the actuator 30, and are part of the external forces that are exerted on the tether 40.

If the magnitude of the external forces exerted on the tether 40 are large enough, they can cause the tether 40 to buckle or bend, effectively limiting the total actuation force that may be applied to the A-frame structure 20 and increasing the time required to move the A-frame structure 20 from one position to another, relative to the substrate 100. If the tether 40 buckles or bends, it may act similar to a leaf spring, bending in response to the applied external force and storing elastic energy which may be reapplied to the system in a backlash situation, an oscillatory situation, or both. A backlash occurs when the actuator 30 begins moving back toward its static position and the tether 40 buckles but does not initially lower the A-frame structure 20. Once a sufficient force (i.e., elastic energy) is stored in the tether 40, the tether 40 will lower the A-frame structure 20 in an uncontrolled slapping manner, possibly causing damage to one or more portions of the MEM optical system 10. In addition, any bending/buckling of the tether 40 may produce mechanical oscillations of the tether 40. These mechanical oscillations may be produced by the above-noted backlash, by the manner in which the actuator 30 accelerates (positively or negatively), by a combination thereof, or by external forces from another source(s).

In order to address the backlash and oscillation problems, it may be desirable to use a tether 40 that is stiff enough to withstand the compressive restoring forces exerted thereon without flexing to an undesired degree, including when moving the A-frame structure 20. In general, slender columns, such as the tether 40, may fail in response to compressive forces by buckling. The compressive force required to begin buckling of a slender column (i.e., buckling force) is defined by Euler's formula:

$$F_B = (\chi^2 EI)/L^2$$

where $F_B$ is the greatest force a slender column may withstand without buckling, E is the column's modulus of elasticity, I is the moment of inertia across the beams transverse cross-section (e.g., $I=bh^3/12$ for a rectangular cross section), and L is the length of the beam. The force produced by the actuator support springs 56 may be described in some instances by Hooke's law:

$$F_s = kx$$

where $F_s$ is the stored restoring force of an elongated spring stretched over a distance x with the spring constant of k. Accordingly, the actuation force exerted on the tether 40 to move the same and the buckling force of the tether 40 may be expressed in common terms (e.g., micro-newtons, $\mu$N). In order to prevent buckling in the tether 40 (e.g., to produce a stiff tether) the tether's 40 minimum buckling force, $F_B$, should be at least as great as the "x" component of the largest actuation force that will be applied to the tether 40 to move the tether and the A-frame structure 20 interconnected therewith. Consider the case where the tether 40 is formed from a single level of polysilicon having cross-sectional dimensions of 2 $\mu$m height by 10 $\mu$m width and a length of 1600 $\mu$m. Here the expected buckling strength, $F_s$, would be around 4 $\mu$N. Now consider that a typical actuator support spring 56 or that the actuator 30 can otherwise actively deliver an actuation force to the tether 40 in the "x dimension" that may be well over 20 $\mu$N. In this case, the tether 40 having the above-noted dimensions would buckle. Generally speaking, the desired buckle strength for the tether 40 (where its buckle strength is at least as great as the "x component" of the actuation force exerted on the tether 40 to purposefully move the tether 40 and the A-frame structure 20 interconnected therewith) may be realized by increasing the moment of inertia (e.g., increase the width, the height, or both) of at least a portion of the tether 40 in an appropriate manner.

Figure 8:
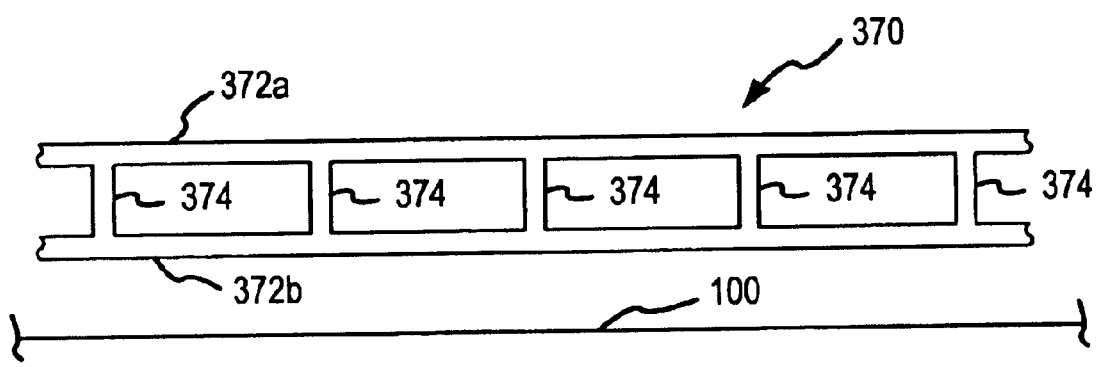
FIG. 8 is a side view of one embodiment of a multi-layered tether to provide a desired stiffness.

One way to increase the buckle strength of the tether 40 when at least part of the MEM optical system 10 is fabricated using surface micromachining techniques, is to define the tether 40 from a plurality of structural layers. The tether 370 of FIG. 8 utilizes such a construction, and may be utilized by any of the above-noted embodiments. Generally, the tether 370 is defined by at least two structural layers 372 (372a and 372b in the illustrated embodiment) that are disposed in vertically spaced relation, and that are rigidly anchored to each other by a plurality of interconnections 374 that are typically spaced along the length of the tether 370. Any way of rigidly interconnecting adjacent structural layers 372 of the tether 370 may be utilized and in a manner so as to attain a desired magnitude of stiffness or buckle strength between its opposite ends. Although the structural layers 372a, 372b, and interconnections 374 may be formed from "spaced-in-time" depositions in a surface micromachining process, no "joint" of any kind will be evident in the resulting structure since the structural layers 372a, 372b, and interconnections 374 are typically formed from the same type of material in a surface micromachining process. That is, the coupling 370 will appear to be an integrally formed structure at least at some level.

When a tether 40 is utilized that has a sufficient stiffness to withstand the "x" component of the largest actuation force that is exerted on the tether 40 for purposes of moving the A-frame structure 2—from one position to another (e.g., the restoring forces of the actuator support springs 56 (i.e., $F_B \geq F_s$)), the response time of the optical system 10 may be improved. Stated another way, utilizing a stiff tether 40 maximizes the transmission of the actuation force to the A-frame structure 20, whether this actuation force is "passively generated" (e.g., via the potential energy stored in the actuator support springs 56), "actively generated" (e.g., by providing an actuation signal to the actuator 30), or by a combination thereof. For example, a sufficiently stiff tether 40 allows the tether 40 and, therefore, the A-frame structure 20 and reflective microstructure 12, to move in unison with the actuator 30 when the actuator's 30 movable frame 36 begins moving from one position to another. Therefore, increased switching speed of the MEM optical system 10 may be accomplished by using stiffer actuator support springs 56 such that they supply an increased and, therefore, quicker actuation force to the A-frame structure 20 and reflective microstructure 12 when a voltage is changed across the actuator combs 32, 34. In one embodiment, switching times short than about 20 milliseconds may be realized through use of such a stiff tether 40.

One way to integrate tether 40 having the above-noted stiffness is by compliantly attaching one of or both the movable frame 36 on the actuator 30 and the A-frame structure 20 to the tether 40 so as to allow these structures to move relative to one another as the A-frame structure 20 moves relative to the substrate 100. Accordingly and as shown in FIG. 2, the first end 41 of the tether 40 is attached to the A-frame structure 20 by a compliant member 43 and the second end 42 of the tether 40 is attached to the movable frame 36 of the actuator 30 by compliant member 44. As described above, in accordance with the flexible member 72 used for attaching the elevation members 22 to their respective anchor points 70, compliant members 43 and 44 may be formed such that they have a moment of inertia about their bending axes that is substantially less than the moment of inertia of the tether 40 about the same axes. This relatively lower moment of inertia in the compliant members 43 and 44 substantially isolates bending to the compliant members 43 and 44 when the tether 40, A-frame structure 20 and movable frame 36 move relative to one another during operation of the optical system 10. It should be appreciated that the length of the compliant members 43, 44 need not be small compared to the length of the tether 40. Moreover, members 43, 44 and the flexible members 72 may be configured so as to contribute to the actuation force to move the A-frame structure 20 from one position to another.

The way in which a tether generally of the above-described type interconnects with an elevation structure generally of the above-described type may have an effect on the operation of a positioning system in a microelectromechanical system that utilizes these types of devices. Various ways of establishing this interconnection are illustrated in FIGS. 9–14. The positioning systems 378 et al. illustrated therein may be used for any appropriate application (e.g., to move any appropriate microstructure by interconnecting the same with the elevation structure 382 in any appropriate manner), including without limitation for use in place of the positioning systems 18–19 of FIG. 1.

Figure 9:
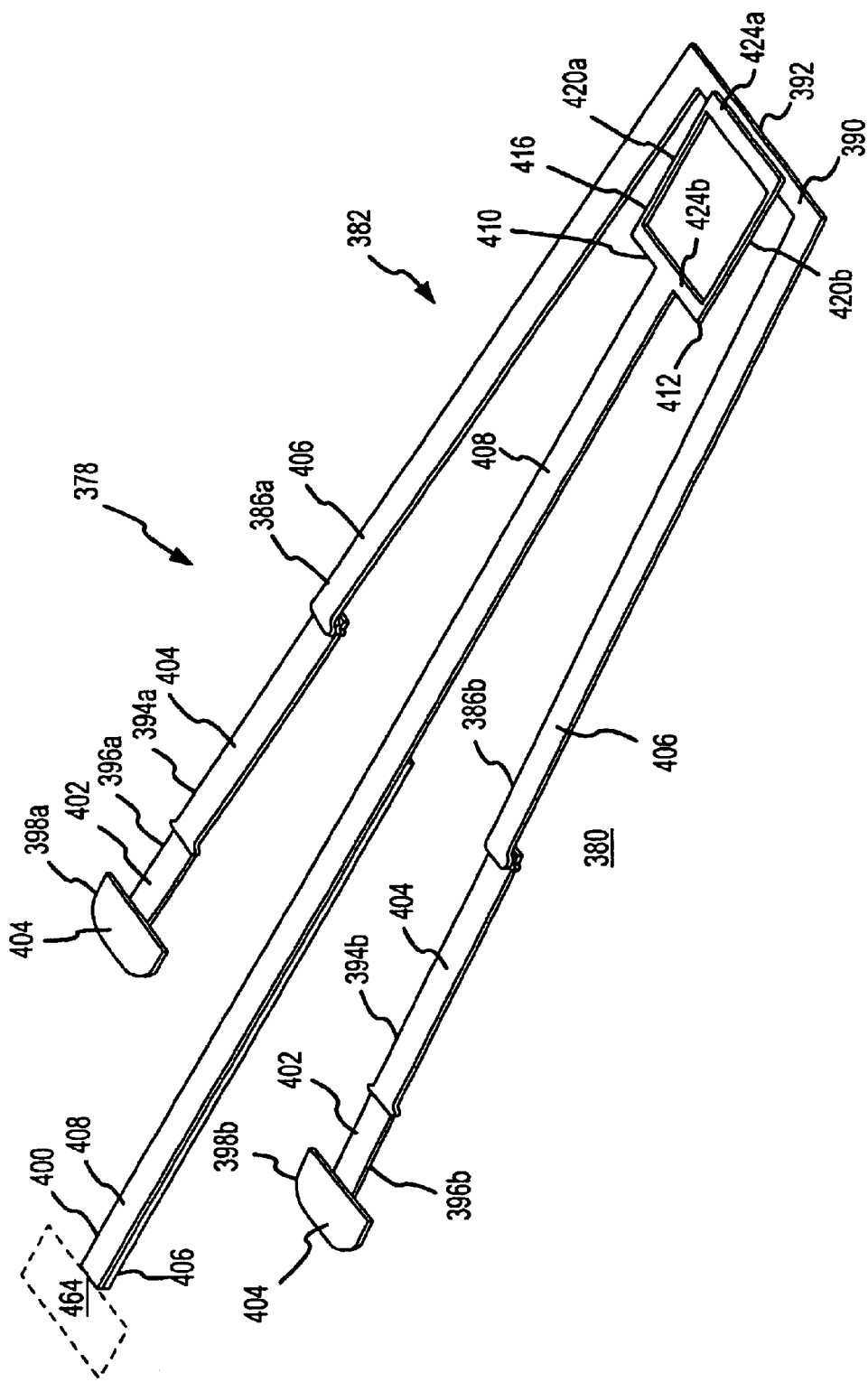
FIG. 9 is a perspective view of one embodiment of a positioning system with one embodiment of a connector between a coupling/tether and an elevation structure.

One way of establishing the noted interconnection is illustrated in FIG. 9 for the case where surface micromachining is used to define at least a positioning system 378 of a microelectromechanical system. Generally, such a surface micromachined positioning system 378 is defined in one or more of four vertically spaced structural levels, namely a Poly1 level 402, a Poly2 level 404, a Poly3 level 406, and a Poly4 level 408 (an appropriate sacrificial material having been removed from between each of these structural levels in the release of the microelectromechanical system by exposure to one or more release etchants). The positioning system 378 includes an elevation structure or lever/lever assembly 382 that is interconnected with an actuator assembly 464 by an elongate coupling or tether 400. The actuator assembly 464 includes one or more actuators of any appropriate type for microelectromechanical applications, and may be directly or indirectly (e.g., through a displacement multiplier of any appropriate type/configuration) interconnected with the tether 400.

The elevation structure 382 is formed in both the Poly3 level 406 and the Poly2 level 404 in the case of the FIG. 9 embodiment. In this regard, the elevation structure 382 includes a pair of lower legs 394a, 394b that are defined in the Poly2 level 404, a pair of upper legs 386a, 386b that are defined in the Poly3 level 406 and that appropriately anchored to the corresponding lower leg 394a, 394b, and a cross member 390 that is also defined in the Poly3 level 406, that interconnects the upper legs 386a, 386b, and that is disposed at/defines a free end 392 of the elevation structure 382. The elevation structure 382 is movably interconnected with a substrate 380 on which the microelectromechanical system is fabricated. This movable interconnection is provided by a pair of compliant flexures 396a, 396b that are formed in the Poly1 level 402 of the microelectromechanical system. Generally, each compliant flexure 396a, 396b is less rigid than the elevation structure 382 to allow the free end 392 of the elevation structure 382 to be moved away from the substrate 380 by a flexing of the compliant flexures 396a, 396b. One portion of each compliant flexure 396a, 396b is appropriately anchored to its lower leg 394a, 394b of the elevation structure 382, while another portion is attached to a corresponding anchor 398a, 398b. Both anchors 398a, 398b extend down to and are attached to the substrate 380. Generally, the elevation structure 382 may be of any configuration and formed in one or more of the levels 402, 404, 406, and 408. One advantage to forming the elevation structure 382 in multiple levels 402, 404, 406, and 408 is that different portions of the elevation structure 382 may be configured to have different moments and/or may be reduce the total amount of force that needs to be exerted on the elevation structure 382 to move the same away from the substrate 380.

The elongate coupling or tether 400, which may be at least generally of the above-described type in relation to enhanced stiffness or rigidity, extends between and interconnects the actuator assembly 464 and the elevation structure 382. The tether 400 is defined in both the Poly3 level 406 and the Poly4 level 408 to provide a desired degree of stiffness. That portion of the tether 400 that is defined in the Poly3 level 406 is attached to that portion of the tether 400 that is defined in the Poly4 level 408 at a plurality of spaced locations along a portion of the length of the tether 400 (not shown in FIG. 9, but see the FIG. 12 embodiment to be discussed in more detail below). Any way of anchoring the Poly4 level 408 of the tether 400 to the Poly3 level 406 of the tether 400 may be utilized.

The tether 400 is indirectly interconnected with the elevation structure 382 in the FIG. 9 embodiment by a connector 412. The connector 412 is formed in the Poly4 level 408. That portion of the tether 400 that interfaces with the connector 412 is also formed in the Poly4 level 408. The connector 412 is defined by a frame 416. Members of this frame 416 include a pair of at least generally longitudinally spaced and at least generally laterally extending connector ends 424a, 424b, and a pair of at least generally laterally spaced and at least generally longitudinally extending flex links 420a, 420b. As such, the connector ends 424a, 424b are disposed at least generally transverse to the tether 400, while the flex links 420a, 420b extend at least generally in the same direction as the tether 400. The end 410 of the tether 400 is attached to the connector end 424b. Where surface micromachining is used to define the positioning system 378 and where the connector 412 and the portion of the tether 400 that interfaces with the connector 412 are both formed in the Poly4 level 408 as in the case of the illustrated embodiment, there will not be a joint of any kind between the connector 412 and the tether 400 (i.e., connector 412 and the portion of the tether 400 that is defined in the Poly4 level 408 will be integrally formed or of one-piece construction). In any case, the other end 424a of the connector 412 is attached to the cross beam 390 of the elevation structure 382 at least at one location, and more typically by plurality of laterally spaced anchors (not shown). The flex links 420a, 420b of the connector 412 function as pivot joints by flexing about an axis that is at least generally transverse to the links 420a, 420b during movement of the tether 400 via the actuator assembly 464.

When the tether 400 is placed in tension by a movement of the actuator assembly 464 that is at least generally away from the elevation structure 382 so as to move the free end 392 of the elevation structure 382 at least generally away from the substrate 380, both of the flex links 420a, 420b of the connector 412 are also placed in tension. Conversely, when the tether 400 is placed in compression by a movement of the actuator assembly 464 that is at least generally toward the elevation structure 382 (e.g., in the opposite direction to the foregoing) so as to move the free end 392 of the elevation structure 382 at least generally toward the substrate 380, the flex links 420a, 420b of the connector 412 are also placed in compression. In the event that these compressive forces exceed a certain level, the flex links 420a, 420b may flex between the connector ends 424a, 424b. Although this may be desirable in one or more respects, this may adversely affect one or more aspects of the operation of the positioning system 378. For instance, the configuration of the connector 412 may limit the magnitude of the restoring force that may be exerted on the elevation structure 382 by the actuator assembly 464 (through the tether 400 and the connector 412) to move its free end 392 back toward the substrate 380, and thereby may reduce the frequency response of the positioning system 378. Although this may be acceptable in some applications, it may not be for others.

Figure 10:
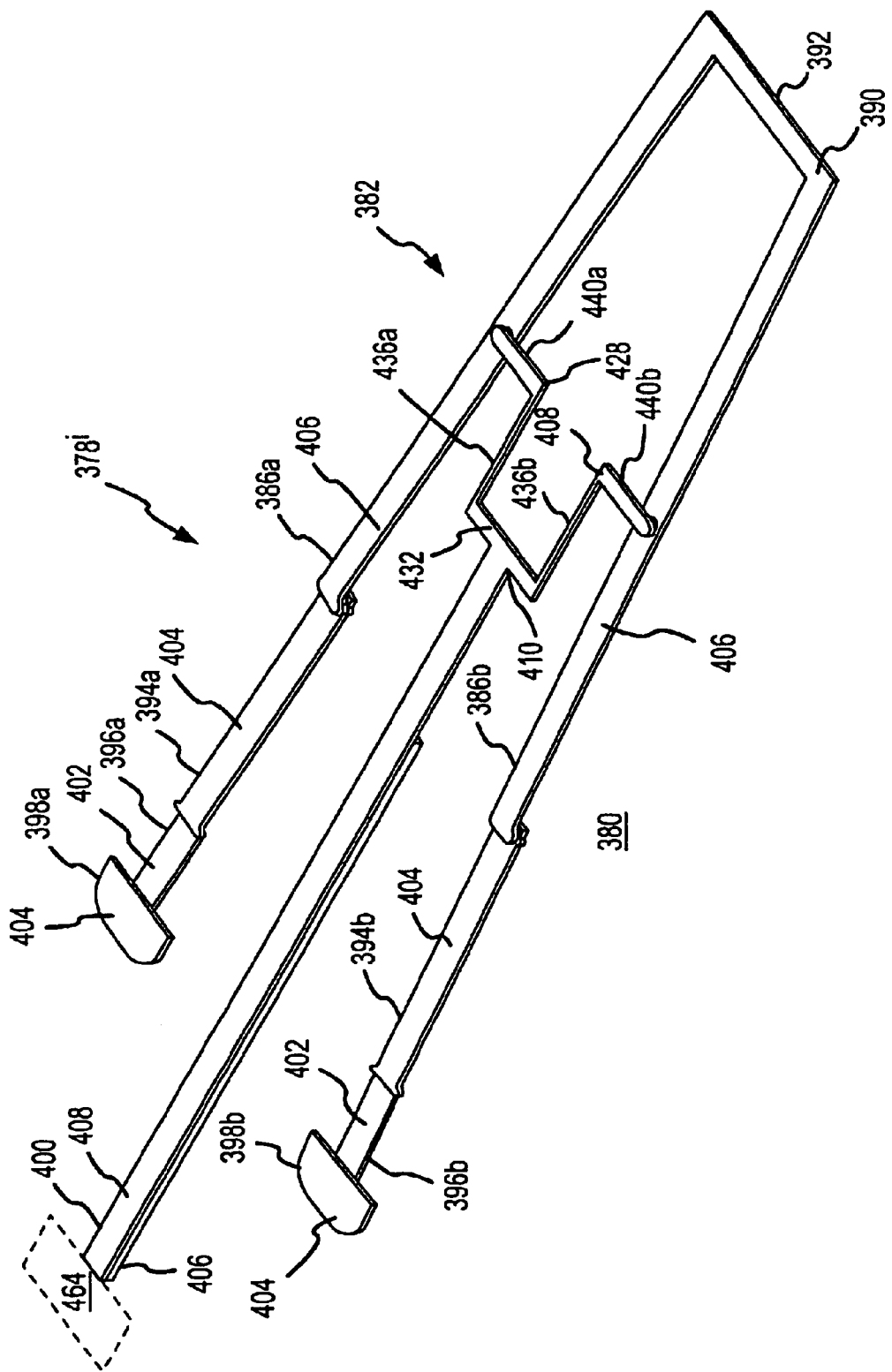
FIG. 10 is a perspective view of a variation of the positioning system of FIG. 9 in relation to the connector between the coupling/tether and the elevation structure.

Another way of interconnecting the tether 400 and the elevation structure 382 is illustrated in FIG. 10. Those components of the FIG. 9 embodiment that are also used in the FIG. 9 embodiment are identified by the same reference numeral. A "superscript" designation means that there is at least one difference between the corresponding components of the embodiments of FIGS. 9–10. The tether 400 is indirectly interconnected with the elevation structure 382 in the positioning system $378^i$ of FIG. 10 embodiment by a connector 428. The connector 428 is formed in the Poly4 level 408, and includes an at least generally laterally extending connector end 432, a pair of at least generally laterally spaced and longitudinally extending flex links 436a, 436b that extend from the end 432 at least generally toward the free end 392 of the elevation structure 382, and a pair of interconnects 440a, 440b that extend from their corresponding flex link 436a, 436b to their corresponding leg 386a, 386b. As such, both the connector end 432 and the interconnects 440a, 440b are disposed at least generally transverse to the tether 400, while the flex links 436a, 436b extend at least generally parallel to the tether 400.

The end 410 of the tether 400 is attached to the end 432 of the connector 428 and is formed in the Poly4 level 408. Where surface micromachining is used to define the positioning system 378$^i$ and where the connector 428 and the portion of the tether 400 that interfaces with the connector 428 are both formed in the Poly4 level 408, as in the case of the FIG. 10 embodiment, there will not be a joint of any kind between the connector 428 and the tether 400 (i.e., the connector 428 and the portion of the tether 400 that is defined in the Poly4 level 408 will be integrally formed or of one-piece construction).

The connector 428 is attached to the elevation structure 382 by the flex link interconnects 440a, 440b. These flex link interconnects 440a, 440b are disposed above their corresponding leg 386a, 386b of the elevation structure 382 and are appropriately attached thereto by a one or more anchors. Based upon this configuration and manner of interconnecting the tether 400 and the elevation structure 382, the flex links 436a, 436b of the connector 428 function as pivot joints by flexing between their corresponding interconnect 440a, 440b and the connector end 432 if sufficient forces are exerted on the connector 428.

When the tether 400 is placed in tension by a movement of the actuator assembly 464 that is at least generally away from the elevation structure 382 so as to move the free end 392 of the elevation structure 382 at least generally away from the substrate 380, the flex links 436a, 436b of the connector 428 are also placed in tension and a torsional force may be exerted on each of the interconnects 440a, 440b. Conversely, when the tether 400 is placed in compression by a movement of the actuator assembly 464 that is at least generally toward the elevation structure 382 (e.g., in the opposite direction to the foregoing) so as to move the free end 392 of the elevation structure 382 at least generally toward the substrate 380, the flex links 436a, 436b of the connector 428 are also placed in compression and a torsional force may be exerted on each of the interconnects 440a, 440b (in an opposite direction to the first noted instance). In the event that these compressive forces exceed a certain level, the flex links 436a, 436b of the connector 428 may flex between the connector end 432 and their corresponding interconnect 440a, 440b. Although this may be desirable in one or more respects, this may adversely affect one or more aspects of the operation of the positioning system 378$^i$. For instance, the configuration of the connector 428 may limit the magnitude of the restoring force that may be exerted on the elevation structure 382 by the actuator assembly 464 (through the tether 400 and the connector 412) to move its free end 392 back toward the substrate 380, and thereby may reduce the frequency response of the positioning system 378$^i$. Although this may be acceptable in some applications, it may not be for others.

Figure 11:
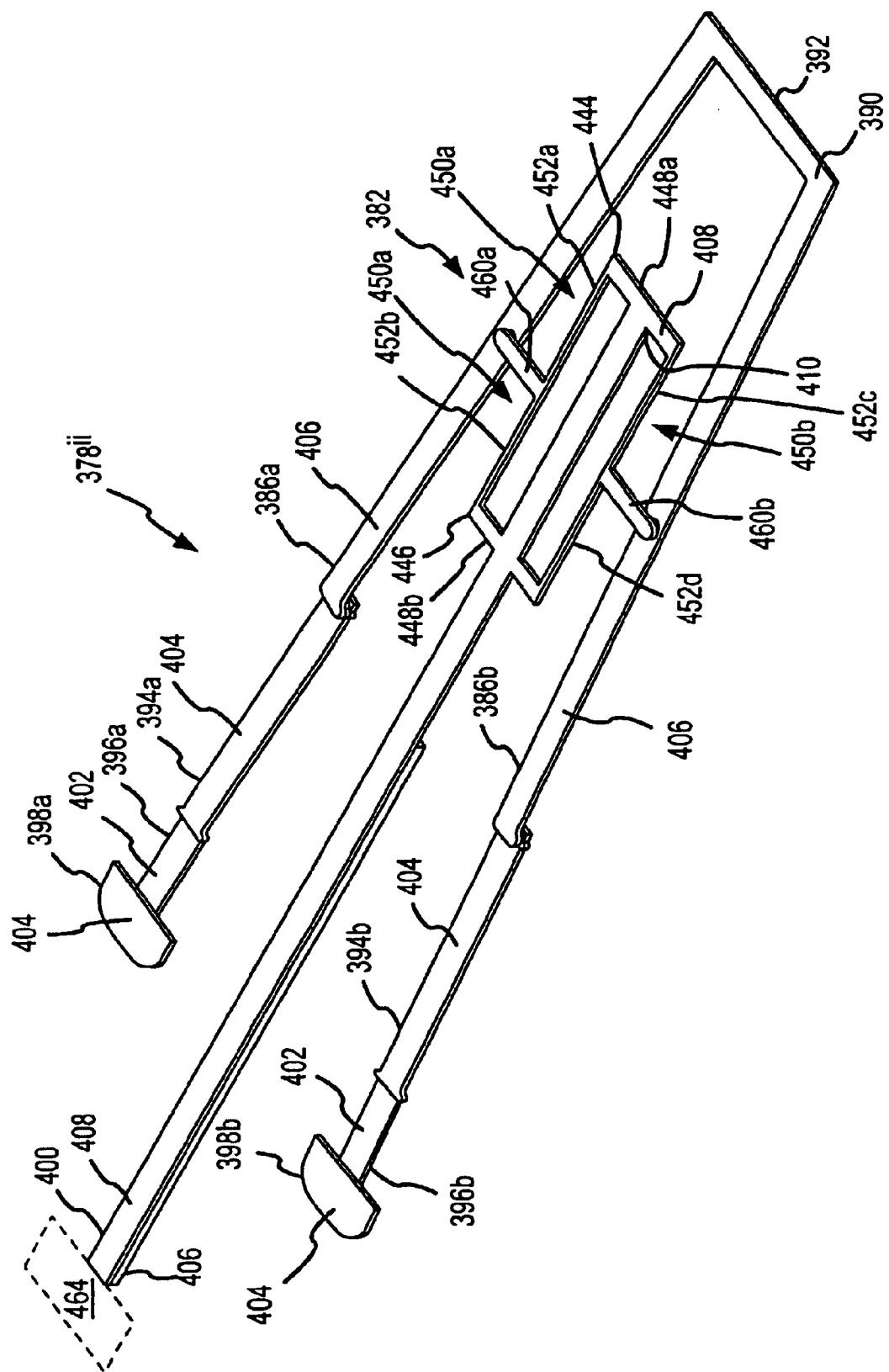
FIG. 11 is a perspective view of a variation of the positioning system of FIG. 9 in relation to the connector between the coupling/tether and the elevation structure.

Another way of interconnecting the tether 400 and the elevation structure 382 is illustrated in FIG. 11. Those components of the FIG. 9 embodiment that are also used in the FIG. 11 embodiment are identified by the same reference numeral. A "superscript" designation means that there is at least one difference between the corresponding components of the embodiments of FIGS. 9 and 11. The tether 400 is indirectly interconnected with the elevation structure 382 in the positioning system 378$^{ii}$ of FIG. 11 embodiment by a connector 444. The connector 444 is formed in the Poly4 level 408 and is defined by an at least generally rectangular frame 446. A pair of interconnects 460a, 460b attach the frame 446 to the corresponding upper leg 386a, 386b of the elevation structure 382. In the illustrated embodiment, the interconnects 460a, 460b are disposed at a longitudinal midpoint of the frame 446 (i.e., half-way between a pair of longitudinally spaced connector ends 448a, 448b) and are each disposed along a common reference axis. However, the interconnects 460a, 460b may be disposed at other longitudinal locations along the frame 446, including where the interconnects 460a, 460b are disposed at different longitudinal locations. Moreover, the interconnects 460a, 460b could be oriented other than along a common reference axis (e.g., in offset relation) or other than transverse to the tether 400.

The frame 446 includes a pair of longitudinally spaced and at least generally laterally extending ends 448a, 448b as noted, and a pair of laterally spaced and at least generally longitudinally extending flex link assemblies 450a, 450b. The flex link assembly 450a includes a pair of flex links 452a, 452b, while the flex link assembly 450b includes a pair of flex links 452c, 452d. The flex links 452a, 452b of the flex link assembly 450a are disposed on one side of the tether 400, while the flex links 452c, 452d of the flex link assembly 450b are disposed on the opposite side of the tether 400 (i.e., the flex links 452a, 452b are laterally spaced in relation to the flex links 452c, 452d). Preferably, the tether 400 bisects the frame 446 in the lateral dimension, although such need not be the case. In any case, the flex link 452a extends from where the interconnect 460a merges with the frame 446 and the connector end 448a, while the flex link 452b extends from where the interconnect 460a merges with the frame 446 and the opposite connector end 448b. Similarly, the flex link 452c extends from where the interconnect 460b merges with the frame 446 and the connector end 448a, while the flex link 452d extends from where the interconnect 460b merges with the frame 446 and the opposite connector end 448b. As such, both the connector ends 448a, 448b and the interconnects 460a, 460b are disposed at least generally transverse to the tether 400, while the flex links 452a–d each extend at least generally in the same direction as or parallel to the tether 400. Although the flex links 452a, 452b are disposed along a common axis and the flex links 452c, 452d are disposed along a common axis in the FIG. 11 embodiment, such need not be the case.

The end 410 of the tether 400 is attached to the connector end 448a of the connector 444, and the tether 400 is also attached to the connector end 448b of the connector 444. The portion of the tether 400 that interfaces with the connector 444 is formed in the Poly4 level 408. Where surface micromachining is used to define the positioning system 378$^{ii}$ and where the connector 444 and the portion of the tether 400 that interfaces with the connector 444 are both formed in the Poly4 level 408 as in the case of the FIG. 11 embodiment, there will not be a joint of any kind between the connector 444 and the tether 400 (i.e., the connector 444 and the portion of the tether 400 that is defined in the Poly4 level 408 will be integrally formed or of one-piece construction). The connector 444 is also attached to the elevation structure 382 by the interconnects 460a, 460b. These interconnects 460a, 460b are disposed above their corresponding upper leg 386a, 386b of the elevation structure 382 and are appropriately attached thereto by a one or more anchors.

When the tether 400 is placed in tension by a movement of the actuator assembly 464 that is at least generally away from the elevation structure 382 so as to move the free end 392 of the elevation structure 382 at least generally away from the substrate 380, the flex links 452b, 452d of the connector 444 are placed in tension, the flex links 452a, 452c of the connector 444 are placed in compression, and a torsional force may be exerted on each of the interconnects 460a, 460b. This torsional force may place a tensile force on each of the flex links 452a–d. Conversely, when the tether 400 is placed in compression by a movement of the actuator assembly 464 that is at least generally toward the elevation structure 382 (e.g., in the opposite direction to the foregoing) so as to move the free end 392 of the elevation structure 382 at least generally toward the substrate 380, the flex links 452b, 452d of the connector 444 are placed in compression, the flex links 452a, 452c of the connector 444 are placed in tension, and a torsional force may be exerted on each of the interconnects 460a, 460b (in an opposite direction to the first noted instance). Having one flex link 452 on one side of the tether 400 being in tension and another flex link 452 on this same side of the tether 400 being in compression, whether the tether 400 is in compression or tension, improves upon the manner in which the forces being exerted on the tether 400 are transferred to the elevation structure 382.

Figure 12:
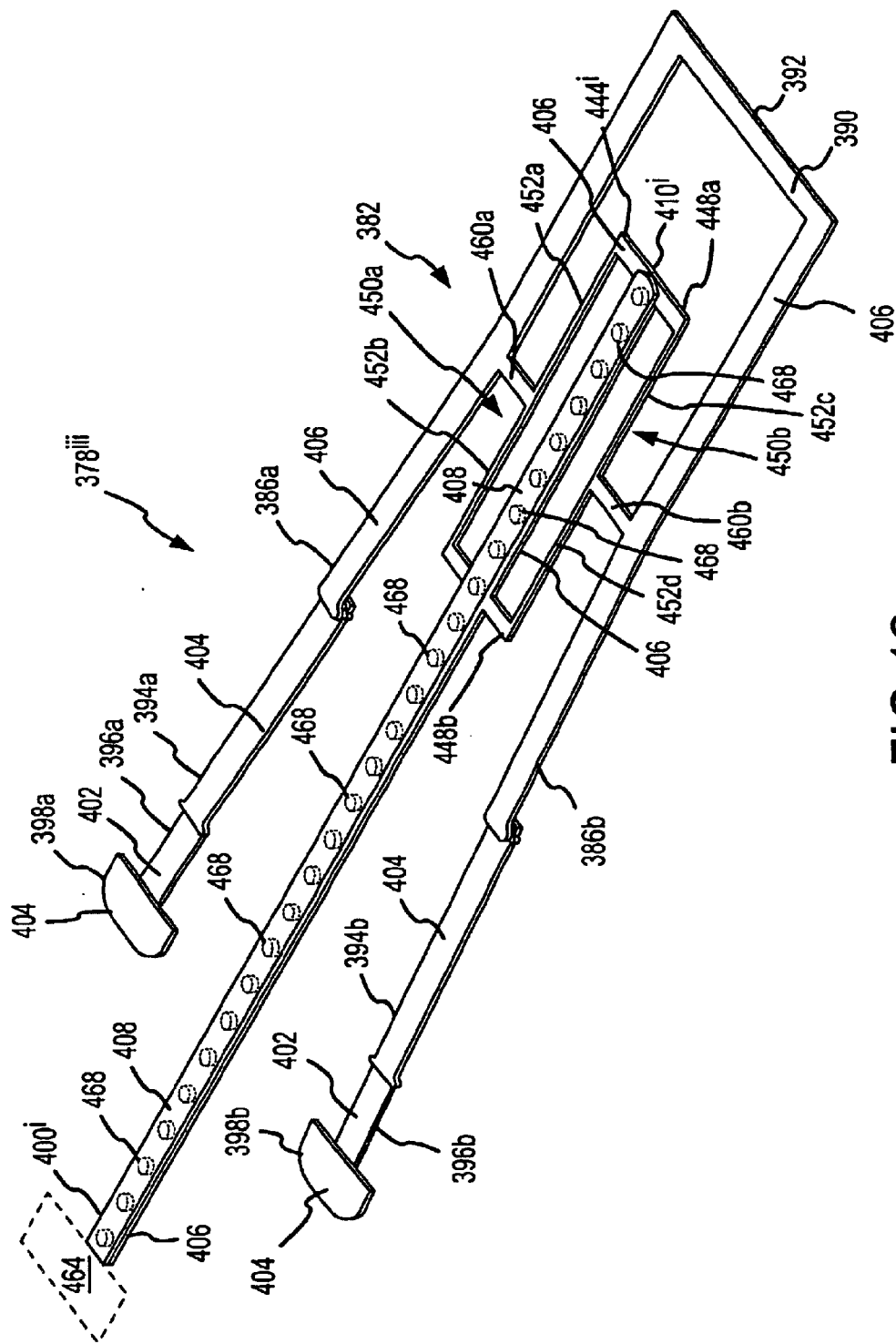
FIG. 12 is a perspective view of a variation of the positioning system of FIG. 9 in relation to the connector and the coupling/tether.

Another way of interconnecting the tether 400 and the elevation structure 382 is illustrated in FIG. 12. The embodiment of FIG. 12 is similar to the embodiment of FIG. 11. Those components of the FIG. 12 embodiment that are also used in the FIG. 12 embodiment are identified by the same reference numeral. A "superscript" designation means that there is at least one difference between the corresponding components of the embodiments of FIGS. 11 and 12. There are two main differences between the positioning system $378^{ii}$ of FIG. 11 and the positioning system $378^{iii}$ of FIG. 12. One is that the connector $444^{i}$ is formed in the Poly3 level 406 in the FIG. 12 embodiment, versus in the Poly4 level 408 in the case of the FIG. 11 embodiment. That portion of the tether $400^{i}$ that is formed in the Poly3 level 406 is attached to both ends 448a, 448b of the connector $444^{i}$ by an integral connection for the illustrated surface micromachined configuration. Another difference is that the portion of the tether $400^{i}$ that interfaces with the connector $444^{i}$ is formed in both the Poly3 level 406 and the Poly4 level 408 in the case of the FIG. 12 embodiment, versus only in the Poly4 level 408 in the case of the FIG. 11 embodiment. That portion of the tether $400^{i}$ that is formed in the Poly3 level 406 is also anchored to that portion of the tether $400^{i}$ that is formed in the Poly4 level 408 at a plurality of spaced locations preferably along the entire length of the tether $400^{i}$ in the case of the FIG. 12 embodiment by a plurality of anchors 468.

Figure 13:
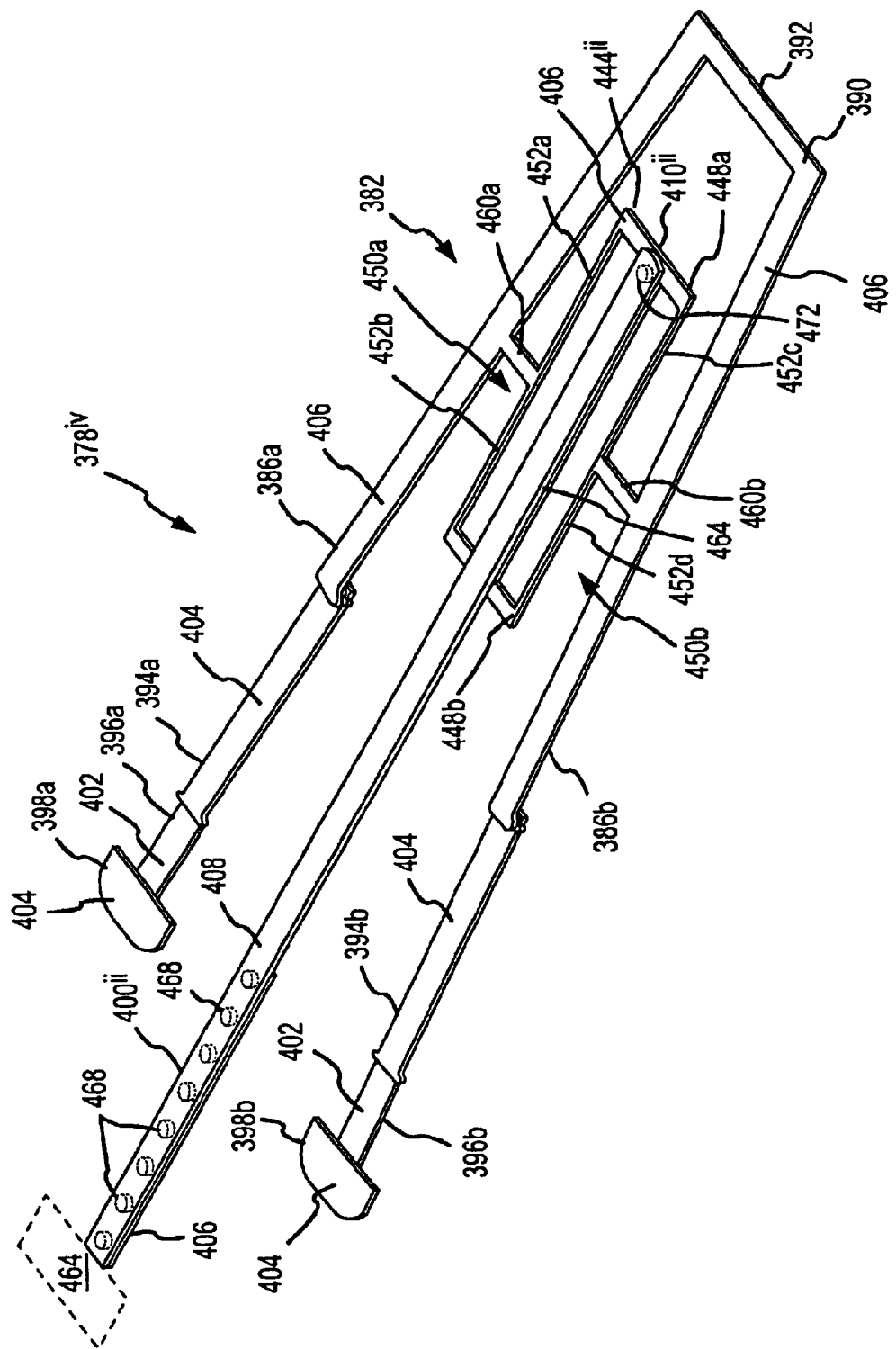
FIG. 13 is a perspective view of a variation of the positioning system of FIG. 9 in relation to the connector and the coupling/tether.

Another way of interconnecting the tether 400 and the elevation structure 382 is illustrated in FIG. 13. The embodiment of FIG. 13 is similar to the embodiment of FIG. 12. Those components of the FIG. 13 embodiment that are also used in the FIG. 12 embodiment are identified by the same reference numeral. A "superscript" designation means that there is at least one difference between the corresponding components of the embodiments of FIGS. 12 and 13. There are a number of differences between the positioning system $378^{iii}$ of FIG. 12 and the positioning system $378^{iv}$ of FIG. 13. A number of these difference relate to the tether $400^{ii}$ and how the same interfaces with the connector $444^{i}$. Initially, the only point of attachment of the tether $400^{ii}$ to the connector $444^{ii}$ of FIG. 13 is at the end 448a of the connector $444^{i}$ (which is at/close to the end $410^{ii}$ of the tether $400^{ii}$), namely via a tether anchor 472. That is, the tether $400^{ii}$ is not anchored to the connector $444^{ii}$ at its end 448b. Another difference is that portion of the tether $400^{ii}$ that is formed in the Poly3 level 406 terminates prior to reaching the end 448b of the connector $444^{ii}$. Stated another way, that portion of the tether $400^{ii}$ that is formed in the Poly3 level 406 is disposed in spaced relation to the end 448b of the connector $444^{ii}$. Finally, the connector $444^{ii}$ includes a center beam 464 that extends between and that is attached to the ends 448a and 448b of the connector $444^{ii}$. This beam 464 is vertically spaced from the overlying tether $400^{ii}$. Once again, since the entirety of the connector $444^{ii}$ is formed in the Poly3 level 406, there will not be any discernible joint between the center beam 464 and the ends 448a, 448b.

Figure 14:
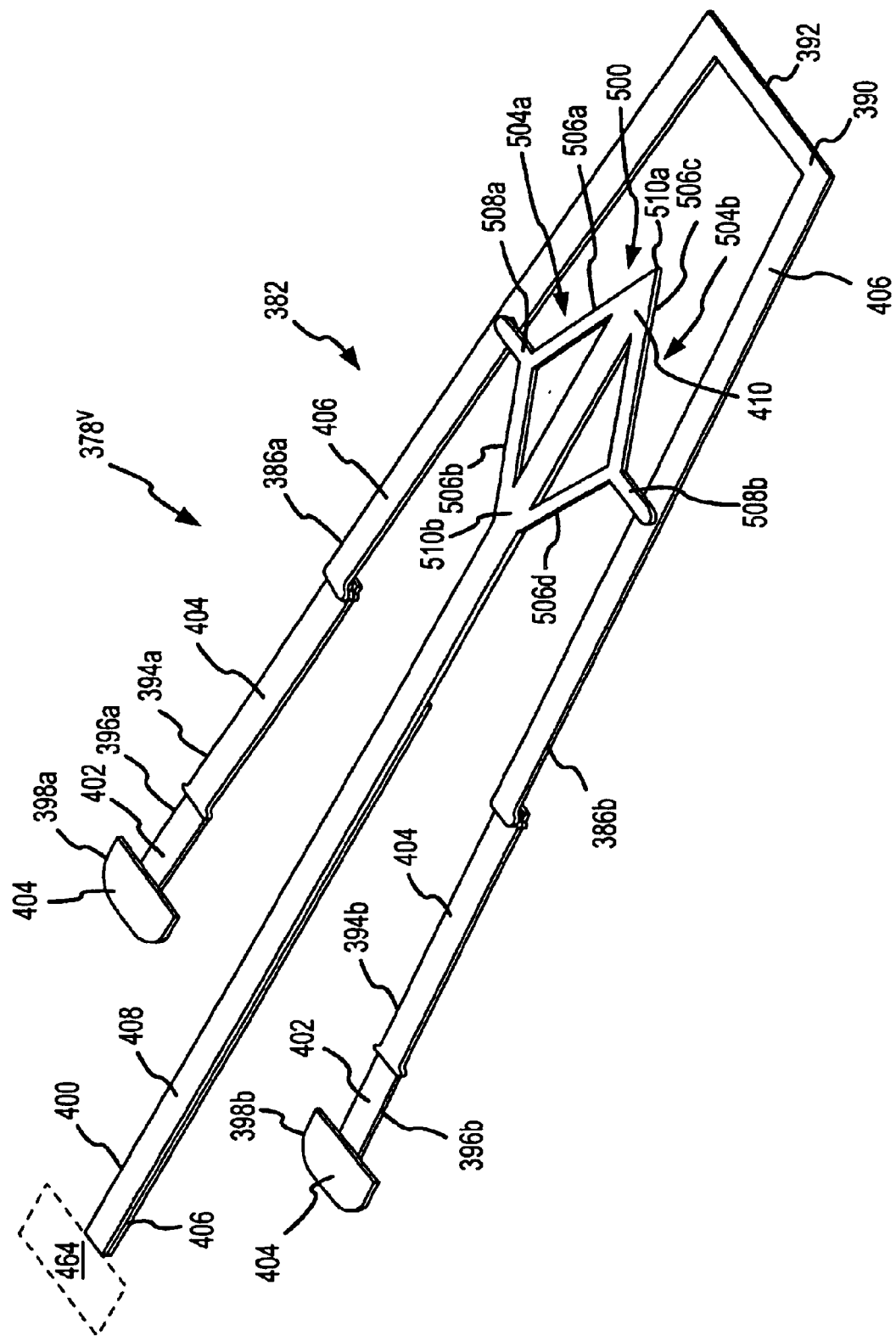
FIG. 14 is a perspective view of a variation of the positioning system of FIG. 9 in relation to the connector between the coupling/tether and the elevation structure.

Another way of interconnecting the tether 400 and the elevation structure 382 is illustrated in FIG. 14. Those components of the FIG. 9 embodiment that are also used in the FIG. 14 embodiment are identified by the same reference numeral. A "superscript" designation means that there is at least one difference between the corresponding components of the embodiments of FIGS. 9 and 14. The tether 400 is indirectly interconnected with the elevation structure 382 in the positioning system $378^{v}$ of FIG. 14 embodiment by a connector 500. The connector 500 is formed in the Poly4 level 408 and is defined by an at least generally diamond-shaped frame 502. A pair of interconnects 508a, 508b attach the frame 502 to the corresponding upper leg 386a, 386b of the elevation structure 382. In the illustrated embodiment, the interconnects 508a, 508b are disposed at a longitudinal midpoint of the frame 502 and are each disposed along a common reference axis. However, the interconnects 508a, 508b may be disposed at other longitudinal locations along the frame 502, including where the interconnects 508a, 508b are disposed at different longitudinal locations. Moreover, the interconnects 508a, 508b could be oriented other than along a common reference axis (e.g., in offset relation) or other than transverse to the tether 400.

The frame 502 includes a pair of at least generally longitudinally extending flex link assemblies 504a, 504b. The flex link assembly 504a includes a pair of flex links 506a, 506b, while the flex link assembly 504b includes a pair of flex links 506c, 506d. The flex links 506a, 506b of the flex link assembly 504a are disposed on one side of the tether 400, while the flex links 506c, 506d of the flex link assembly 504b are disposed on the opposite side of the tether 400 (i.e., the flex links 506a, 506b are laterally spaced in relation to the flex links 506c, 506d). Preferably, the tether 400 bisects the frame 502 in the lateral dimension, although such need not be the case. In any case, the flex link 506a extends from where the interconnect 508a merges with the frame 502 to an end 510a of the connector 500, while the flex link 506b extends from where the interconnect 508a merges with the frame 502 to an opposite end 510b of the connector 500. Similarly, the flex link 506c extends from where the interconnect 508b merges with the frame 502 to the end 510a of the connector 500, while the flex link 506d extends from where the interconnect 508b merges with the frame 502 to the end 510b of the connector 500.

The end 410 of the tether 400 is attached to the end 510a of the connector 500, and the tether 400 is also attached to the end 510b of the connector 500. The portion of the tether 400 that interfaces with the connector 444 is formed in the Poly4 level 408. Where surface micromachining is used to define the positioning system $378^{v}$ and where the connector 500 and the portion of the tether 400 that interfaces with the connector 500 are both formed in the Poly4 level 408 as in the case of the FIG. 14 embodiment, there will not be a joint of any kind between the connector 500 and the tether 400 (i.e., the connector 500 and the portion of the tether 400 that is defined in the Poly4 level 408 will be integrally formed or of one-piece construction). The connector 500 is also attached to the elevation structure 382 by the interconnects 508a, 508b. These interconnects 508a, 508b are disposed above their corresponding upper leg 386a, 386b of the elevation structure 382 and are appropriately anchored thereto.

When the tether 400 is placed in tension by a movement of the actuator assembly 464 that is at least generally away from the elevation structure 382 so as to move the free end 392 of the elevation structure 382 at least generally away from the substrate 380, the flex links 506b, 506d of the connector 500 are placed in tension, the flex links 506a, 506c of the connector 444 are placed in compression, and a torsional force may be exerted on each of the interconnects 508a, 508b. Conversely, when the tether 400 is placed in compression by a movement of the actuator assembly 464 that is at least generally toward the elevation structure 382 (e.g., in the opposite direction to the foregoing) so as to move the free end 392 of the elevation structure 382 at least generally toward the substrate 380, the flex links 506b, 506d of the connector 500 are placed in compression, the flex links 506a, 506c of the connector 500 are placed in tension, and a torsional force may be exerted on each of the interconnects 508a, 508b (in an opposite direction to the first noted instance). Having one flex link 506 on one side of the tether 400 being in tension and another flex link 506 on this same side of the tether 400 being in compression, whether the tether 400 is in compression or tension, improves upon the manner in which the forces being exerted on the tether 400 are transferred to the elevation structure 382.

Although the various connectors presented in FIGS. 9–14 have been described as being fabricated in certain of the levels 402, 404, 406, and 408, these connectors may be formed in any one or more of the levels 402, 404, 406, and 408 and still provide on or more advantages.

The foregoing description of the present invention has been presented for purposes of illustration and description. Furthermore, the description is not intended to limit the invention to the form disclosed herein. Consequently, variations and modifications commensurate with the above teachings and the skill or knowledge of the relevant art are within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A method for operating a microelectromechanical system that is fabricated using a substrate and that comprises an elongate coupling microstructure located between and interconnecting a lever microstructure and an actuator assembly microstructure, as well as a mirror microstructure that is interconnected with a portion of said lever microstructure that is movable relative to said substrate, wherein said elongate coupling microstructure comprises first and second coupling ends, said method comprising the steps of:

executing a first moving step comprising moving said actuator assembly microstructure relative to said substrate in one direction;

pulling on said elongate coupling microstructure in response to said first moving step;

executing a first increasing step comprising increasing a spacing between said first lever end and said substrate in response to said pulling step;

executing a second increasing step comprising increasing a spacing between said mirror microstructure and said substrate in response to said first increasing step;

executing a second moving step comprising moving said actuator assembly microstructure relative to said substrate in a different direction than said first moving step;

pushing on said elongate coupling microstructure in response to said second moving step;

accelerating said elongate coupling microstructure in response to said second moving step;

compressing said elongate coupling microstructure between said first and second coupling ends during at least a portion of said accelerating step;

executing a first decreasing step comprising decreasing a spacing between said first lever end and said substrate in response to said accelerating step, wherein said first decreasing step is at least substantially solely controlled by external forces that are exerted on said elongate coupling microstructure during said accelerating step; and executing a second decreasing step comprising decreasing a spacing between said mirror microstructure and said substrata in response to said first decreasing step.

2. A method, as claimed in claim 1, wherein:

said actuator assembly microstructure comprises at least one actuator microstructure.

3. A method, as claimed in claim 1, wherein:

at least a portion of said accelerating step is due to inertial forces.

4. A method, as claimed in claim 1, wherein:

said first increasing step comprises moving said first lever end along an at least generally arcuate path.

5. A method, as claimed in claim 1, wherein:

movement of said first lever end in said first increasing stop is within a first reference plane that is at least substantially perpendicular to a general lateral extent of said substrate.

6. A method, as claimed in claim 1, wherein:

movement of said first lever end in said first increasing step is within a first reference plane that is disposed other than in perpendicular relation to a general lateral extent of said substrate.

7. A method, as claimed in claim 1, wherein:

said accelerating step comprises exerting a force on said elongate coupling structure microstructure having a component in an x direction of at least about 20 $\mu$N, wherein said x direction. is parallel with a general lateral extent of said substrate 8. A method, as claimed in claim 1, wherein:

said compressing step comprises at least substantially precluding storage of any potential energy in said elongate coupling microstructure.

9. A method, as claimed in claim 1, wherein:

said first decreasing step comprises forming said elongate coupling microstructure with a buckle strength between said first and second coupling ends of said elongate coupling microstructure that is greater than a maximum magnitude of a component of a force in an x direction that is exerted on said elongate coupling microstructure used by said accelerating step, wherein said x direction is parallel with a general lateral extent of said substrate.

10. A method, as claimed in claim 1, wherein:

said first decreasing step comprises at least substantially precluding flexure between said first and second coupling ends of said elongate coupling microstructure during said accelerating step.

11. A method, as claimed in claim 1, wherein:

said second decreasing step comprises moving said mirror microstructure from a first position to a second position in no more than about 20 milliseconds.

* * * * *